US012666749B2

(12) United States Patent
Wang et al.

(10) Patent No.: US 12,666,749 B2
(45) Date of Patent: Jun. 23, 2026

(54) THERMAL DECOMPOSITION APPARATUS AND THERMAL DECOMPOSITION METHOD APPLYING THE SAME

(71) Applicant: INDUSTRIAL TECHNOLOGY RESEARCH INSTITUTE, Hsinchu (TW)

(72) Inventors: Teng-Yu Wang, Hsinchu City (TW); Chih-Lung Lin, Hsinchu City (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 216 days.

(21) Appl. No.: 18/392,621

(22) Filed: Dec. 21, 2023

(65) Prior Publication Data
US 2024/0213396 A1 Jun. 27, 2024

Related U.S. Application Data

(60) Provisional application No. 63/545,352, filed on Oct. 23, 2023.

(30) Foreign Application Priority Data

Dec. 23, 2022 (TW) .................................. 111149598
Dec. 1, 2023 (TW) ................................. 112146906

(51) Int. Cl.
*B32B 43/00* (2006.01)
*H10F 71/00* (2025.01)

(52) U.S. Cl.
CPC ......... *H10F 71/137* (2025.01); *B32B 43/006* (2013.01); *Y10S 156/922* (2013.01);
(Continued)

(58) Field of Classification Search
CPC ............. B32B 43/006; Y10T 156/1153; Y10T 156/1911; Y10S 156/922; Y10S 156/937
See application file for complete search history.

(56) References Cited

U.S. PATENT DOCUMENTS 6,063,995 A     5/2000 Bohland
11,491,774 B1 * 11/2022 Lee ........................ H10F 71/00
(Continued)

FOREIGN PATENT DOCUMENTS

CN     102500601 A     6/2012
CN     202352702 A     7/2012
(Continued)

OTHER PUBLICATIONS

TW Office Action dated Dec. 2, 2024 as received in Application No. 112146906.
(Continued)

*Primary Examiner* — Philip C Tucker
*Assistant Examiner* — Nickolas R Harm
(74) *Attorney, Agent, or Firm* — Maschoff Brennan

(57) ABSTRACT

A thermal decomposition apparatus includes a heating zone, a cooling zone, a first conveying mechanism and a second conveying mechanism. The heating zone has a first space, a first inlet and a first outlet. The first inlet and the first outlet are located at two opposite sides of the first space. The cooling zone has a second space, a second inlet and a second outlet. The second inlet is selectively in space communication connection with the first outlet of the heating zone. The first conveying mechanism is at least partially disposed in the first space. The second conveying mechanism includes a carrier disposed in the second space. The carrier has an inclined surface. A position of the inclined surface located
(Continued)

close to the second inlet is higher than a position of the inclined surface located close to the second outlet along a gravity direction.

22 Claims, 26 Drawing Sheets

(52) U.S. Cl.
CPC ...... *Y10S 156/937* (2013.01); *Y10T 156/1153* (2015.01); *Y10T 156/1911* (2015.01)

(56) References Cited

U.S. PATENT DOCUMENTS

| | | | | |
|---|---|---|---|---|
| 11,845,239 | B1 * | 12/2023 | Fu ..................... | B32B 17/10678 |
| 2015/0090406 | A1 * | 4/2015 | Lee ......................... | H10F 71/00 |
| | | | | 156/711 |
| 2021/0138520 | A1 * | 5/2021 | Wang ........................ | B09B 3/32 |
| 2022/0140175 | A1 * | 5/2022 | Matsumoto ............. | H10F 71/00 |
| | | | | 29/762 |
| 2022/0195139 | A1 | 6/2022 | Sakumoto | |
| 2023/0047286 | A1 * | 2/2023 | Lee ......................... | H10F 19/80 |
| 2023/0241655 | A1 | 8/2023 | Sasai et al. | |

FOREIGN PATENT DOCUMENTS

| | | |
|---|---|---|
| CN | 103978010 | 8/2014 |
| CN | 103978021 | 8/2014 |
| CN | 106206848 | 12/2016 |
| CN | 106391655 | 2/2017 |
| CN | 206199860 A | 5/2017 |
| CN | 108043863 | 5/2018 |
| CN | 108339832 | 7/2018 |
| CN | 108346715 | 7/2018 |
| CN | 110961432 | 4/2020 |
| CN | 111804716 | 10/2020 |
| CN | 213968270 | 8/2021 |
| CN | 114378099 | 4/2022 |
| CN | 114713612 | 7/2022 |
| CN | 114733875 | 7/2022 |
| CN | 114871252 | 8/2022 |
| CN | 115666801 A | 1/2023 |
| CN | 115769384 A | 3/2023 |
| EP | 2858125 | 4/2015 |
| EP | 3989296 | 4/2022 |
| JP | 2005311178 A | 11/2005 |
| JP | 2014000513 A | 1/2014 |
| JP | 2014024037 A | 2/2014 |
| JP | 2014108375 A | 6/2014 |
| JP | 2015217372 A | 12/2015 |
| JP | 2015229126 A | 12/2015 |
| JP | 2016093804 | 5/2016 |
| JP | 2016190177 | 11/2016 |
| JP | 6050834 | 12/2016 |
| JP | 2020-142218 A | 9/2020 |
| JP | 6940893 | 9/2021 |
| JP | 2023-152623 A | 10/2023 |
| KR | 20120000148 | 1/2012 |
| KR | 20120041290 | 5/2012 |
| KR | 20120105330 | 9/2012 |
| KR | 20130080950 | 7/2013 |
| KR | 20130104794 | 9/2013 |
| KR | 101486803 | 1/2015 |
| KR | 101490088 | 2/2015 |
| KR | 20150132719 | 11/2015 |
| TW | I459569 | 11/2014 |
| TW | M597538 | 6/2020 |
| TW | 202142505 | 11/2021 |
| TW | 202204058 | 2/2022 |
| TW | I819933 B | 10/2023 |

OTHER PUBLICATIONS

Taiwan Office Action dated May 5, 2023 as received in application No. 111149598.

* cited by examiner

32a

322a

321a

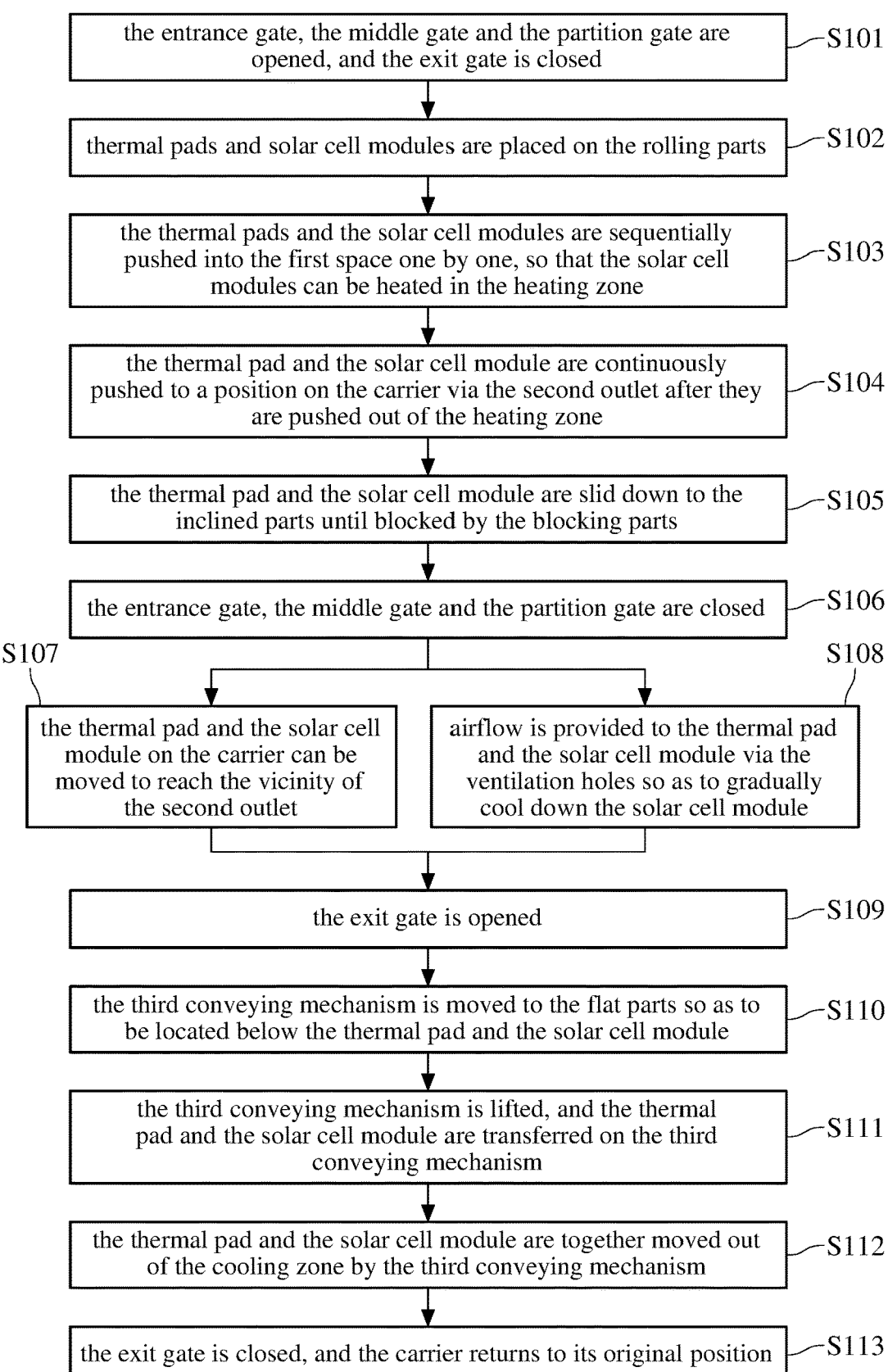

| | |
|---|---|
| the entrance gate, the middle gate and the partition gate are opened, and the exit gate is closed | S101 |
| thermal pads and solar cell modules are placed on the rolling parts | S102 |
| the thermal pads and the solar cell modules are sequentially pushed into the first space one by one, so that the solar cell modules can be heated in the heating zone | S103 |
| the thermal pad and the solar cell module are continuously pushed to a position on the carrier via the second outlet after they are pushed out of the heating zone | S104 |
| the thermal pad and the solar cell module are slid down to the inclined parts until blocked by the blocking parts | S105 |
| the entrance gate, the middle gate and the partition gate are closed | S106 |

S107 — the thermal pad and the solar cell module on the carrier can be moved to reach the vicinity of the second outlet S108 — airflow is provided to the thermal pad and the solar cell module via the ventilation holes so as to gradually cool down the solar cell module

| | |
|---|---|
| the exit gate is opened | S109 |
| the third conveying mechanism is moved to the flat parts so as to be located below the thermal pad and the solar cell module | S110 |
| the third conveying mechanism is lifted, and the thermal pad and the solar cell module are transferred on the third conveying mechanism | S111 |
| the thermal pad and the solar cell module are together moved out of the cooling zone by the third conveying mechanism | S112 |
| the exit gate is closed, and the carrier returns to its original position | S113 |

FIG. 20

THERMAL DECOMPOSITION APPARATUS AND THERMAL DECOMPOSITION METHOD APPLYING THE SAME

CROSS-REFERENCE TO RELATED APPLICATIONS

This non-provisional application claims priority under 35 U.S.C. § 119(a) on Patent Application No(s). 111149598 filed in Taiwan, R.O.C. on Dec. 23, 2022, 63/545,352 filed in U.S.A. on Oct. 23, 2023, and 112146906 filed in Taiwan, R.O.C. on Dec. 1, 2023, the entire contents of which are hereby incorporated by reference.

TECHNICAL FIELD

The present disclosure relates to a thermal decomposition apparatus and a thermal decomposition method applying the same, more particularly to a thermal decomposition apparatus and a thermal decomposition method applying the same for decomposing a solar cell module by high temperature.

BACKGROUND

With the advancement of sustainable energy, a substantial number of solar cell modules are manufactured for deployment in the solar energy sector. Upon reaching the end of their lifespan, certain components of the solar cell modules can be recycled, aligning with the principles of sustainable development. These components of solar cell modules typically encompass aluminum frames, glass plates, cell plates, encapsulation backplanes, and so on. Among them, intact glass plates hold greater value for recycling purpose. Due to the fragile nature of glass plates, on which cell plates are affixed via sealing adhesive and interconnected through the welding of conductive ribbons, separating intact glass plates through simple disassembly is challenging. To achieve this separation, solar cell modules are generally subjected to elevated temperature to decompose the sealing adhesive and disconnect the welds between the conductive ribbons and the cell plates.

The separated glass plates necessitate a cooling process. According to the principle of thermal expansion and contraction, exposure to cold air induces surface compressive stress on the glass plates. Greater temperature difference between the glass plates and the cold air results in heightened surface compressive stress. Should the cooling rates be inconsistent, leading to significant temperature variations across the surface of a glass plate, the glass plate may incur cracks due to disparate compressive stresses. Cracked glass plates hold lower recycling value compared to intact ones.

In order to preserve the integrity of the glass plates, it is customary to place multiple solar cell modules into a single heating apparatus. Following separation, the glass plates are gradually cooled before the removal from the heating apparatus. However, this method requires waiting for a batch of solar cell modules to complete the separation of glass plates before proceeding with subsequent batches, extending the time consumed in the thermal decomposition process. Moreover, when removing the glass plates, the temperature inside the heating apparatus would rapidly drop down due to the influx of cold air. As such, reheating for the subsequent batch of separation work is necessitated, resulting in substantial energy consumption. In another typical method, solar cell modules are conveyed one by one through heating and cooling apparatuses via a conveyor belt. However, in order to prevent excessive temperature difference between the front and rear ends of the glass plates in the conveying direction, the cooling apparatus should not precipitate too rapid temperature drop along the conveying direction. Consequently, a lengthy cooling apparatus is essential, thereby occupying a significant volume within the overall decomposition system.

SUMMARY

The present disclosure provides a thermal decomposition apparatus and a thermal decomposition method applying the same capable of decomposing an intact glass plate from a solar cell module with low energy consumption, shorter processing time and smaller apparatus size with respect to convention.

According to one aspect of the present disclosure, a thermal decomposition apparatus configured to decompose a solar cell module includes a heating zone, a cooling zone, a first conveying mechanism and a second conveying mechanism. The heating zone has a first space, a first inlet and a first outlet that are in space communication connection with one another. The first inlet and the first outlet are located at two opposite sides of the first space. The cooling zone has a second space, a second inlet and a second outlet that are in space communication connection with one another. The second inlet is selectively in space communication connection with the first outlet of the heating zone. The first conveying mechanism is at least partially disposed in the first space, and the first conveying mechanism is configured to move the solar cell module from the first inlet to the first outlet. The second conveying mechanism includes a carrier disposed in the second space. The carrier has an inclined surface. A position of the inclined surface located close to the second inlet is higher than a position of the inclined surface located close to the second outlet along a gravity direction. The carrier is configured to move the solar cell module from the second inlet to the second outlet via the inclined surface. A direction from the first inlet to the first outlet is non-parallel to a direction from the second inlet to the second outlet.

According to another aspect of the present disclosure, a thermal decomposition method configured to decompose a solar cell module includes the following steps: moving the solar cell module from a first inlet of a heating zone into the heating zone so as to heat the solar cell module; moving the solar cell module to a first outlet of the heating zone so as to move the solar cell module outside the heating zone; moving the solar cell module from a second inlet of a cooling zone onto an inclined surface of a carrier inside the cooling zone so as to cooling the solar cell module, wherein the second inlet of the cooling zone is selectively in space communication connection with the first outlet of the heating zone, a temperature at the second inlet of the cooling zone is substantially equal to a temperature at the first outlet of the heating zone, and a position of the inclined surface located close to the second inlet is higher than a position of the inclined surface located close to a second outlet of the cooling zone along a gravity direction; and moving the solar cell module to the second outlet, wherein a temperature at the second outlet of the cooling zone is lower than a temperature at the second inlet of the cooling zone, and a direction from the first inlet to the first outlet is non-parallel to a direction from the second inlet to the second outlet.

According to the thermal decomposition apparatus and the thermal decomposition method applying the same discussed above, a uniform cooling of a solar cell module is ensured during movement thereof in the cooling zone, thereby enhancing a consistent temperature distribution across an entire surface of a glass plate of the solar cell module and mitigating the risk of glass plate crack caused by disparate cooling rates.

BRIEF DESCRIPTION OF THE DRAWINGS

The present disclosure will become more fully understood from the detailed description given hereinbelow and the accompanying drawings which are given by way of illustration only and thus are not intending to limit the present disclosure and wherein:

FIG. 20 is a flow chart of a thermal decomposition method according to one embodiment of the present disclosure;

DETAILED DESCRIPTION

Aspects and advantages of the invention will become apparent from the following detailed descriptions with the accompanying drawings. For purposes of explanation, one or more specific embodiments are given to provide a thorough understanding of the invention, and which are described in sufficient detail to enable one skilled in the art to practice the described embodiments. It should be understood that the following descriptions are not intended to limit the embodiments to one specific embodiment. On the contrary, it is intended to cover alternatives, modifications, and equivalents as can be included within the spirit and scope of the described embodiments as defined by the appended claims.

Figure 1:
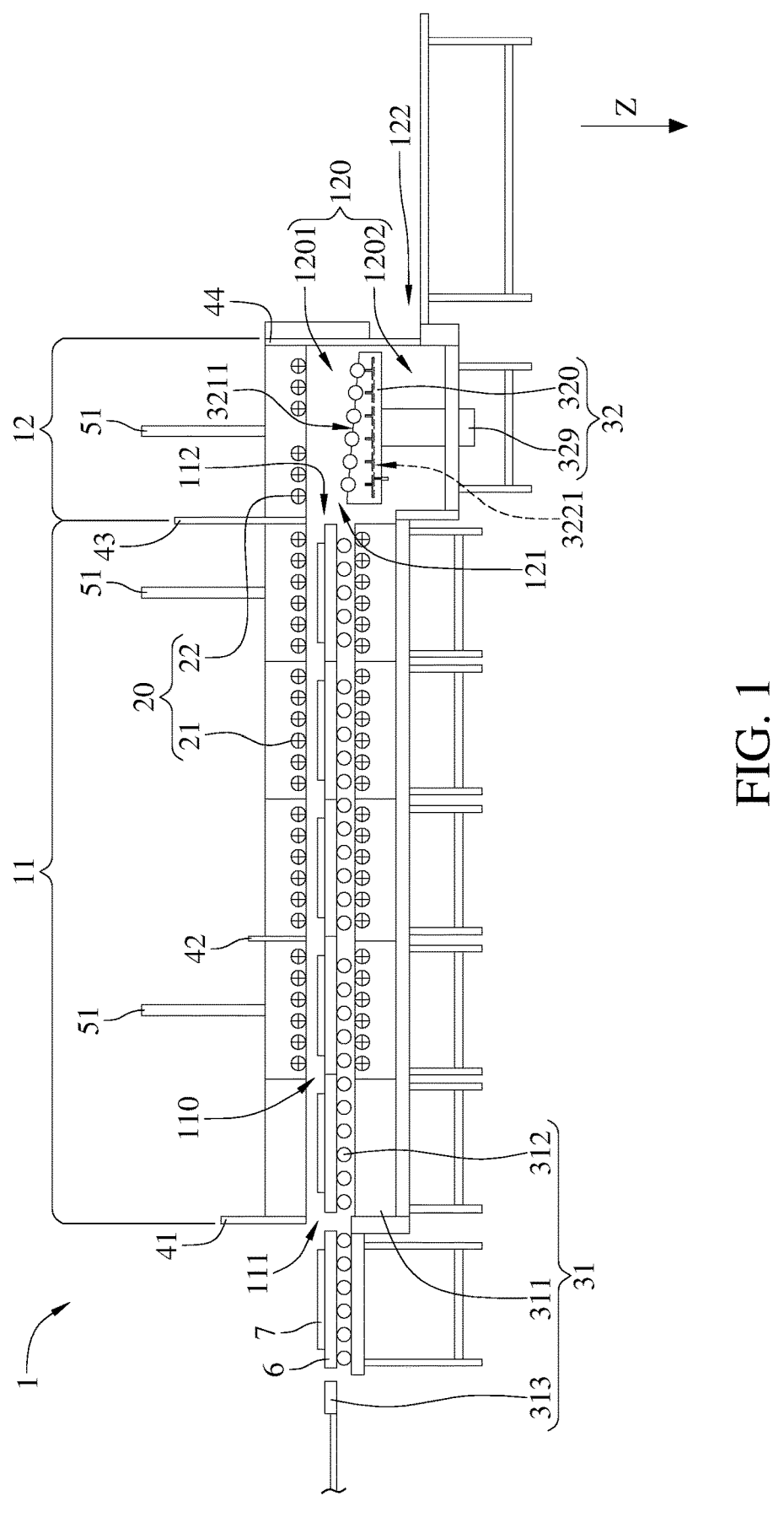
FIG. 1 is a schematic side view of a thermal decomposition apparatus according to one embodiment of the present disclosure.
Figure 6:
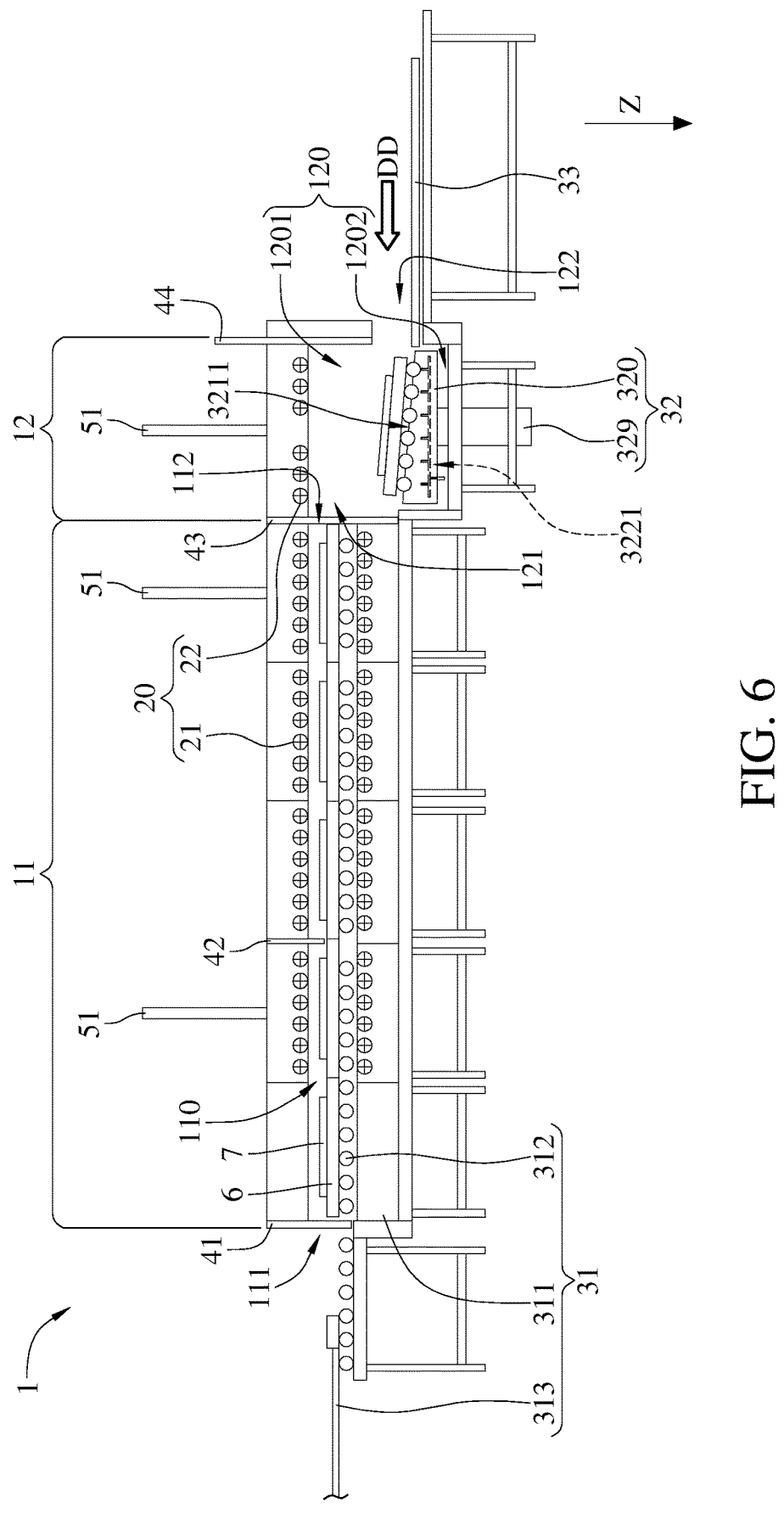

Please refer to FIG. 1 and FIG. 6, where FIG. 1 is a schematic side view of a thermal decomposition apparatus 1 according to one embodiment of the present disclosure, and FIG. 6 is a schematic view showing an action of a thermal decomposition method performed by the thermal decomposition apparatus 1 in FIG. 1. Please be noted that some lateral walls of the thermal decomposition apparatus 1 are omitted in the drawings of the present disclosure for clearly showing inner structures of the thermal decomposition apparatus 1.

The thermal decomposition apparatus 1 provided in one embodiment of the present disclosure can be used to decompose at least one solar cell module 7 placed on at least one thermal pad through high temperature, so that recyclable components such as glass plate(s) of the solar cell module 7 can be completely separated.

The thermal decomposition apparatus may include a heating zone 11, a cooling zone 12, a plurality of temperature adjustment devices 20, a first conveying mechanism 31, a second conveying mechanism 32, a third conveying mechanism 33 (numbered in FIG. 6), an entrance gate 41, a middle gate 42, a partition gate 43, an exit gate 44 and a plurality of exhausting pipes 51.

The heating zone 11 has a first space 110, a first inlet 111 and a first outlet 112 that are in space communication connection with one another. The first inlet 111 and the first outlet 112 are located at two opposite sides of the first space 110.

The cooling zone 12 has a second space 120, a second inlet 121 and a second outlet 122 that are in space communication connection with one another. The second inlet 121 is selectively in space communication connection with the first outlet 112 of the heating zone 11. In this embodiment, a direction from the first inlet 111 to the first outlet 112 is non-parallel to a direction from the second inlet 121 to the second outlet 122. In specific, the direction from the first inlet 111 to the first outlet 112 is substantially perpendicular to the direction from the second inlet 121 to the second outlet 122. In this embodiment, a temperature at the second inlet 121 of the cooling zone 12 is substantially equal to a temperature at the first outlet 112 of the heating zone 11. In the present disclosure, the substantial equality between the temperature at the second inlet 121 and the temperature at the first outlet 112 refers that the temperature difference between the second inlet 121 and the first outlet 112 is, for example, equal to or less than 15 degrees Celsius.

The temperature adjustment devices 20 may include a plurality of first temperature adjustment devices 21 and a plurality of second temperature adjustment devices 22. The first temperature adjustment devices 21 and the second temperature adjustment devices 22 may be, for example, infrared heaters or resistive heaters.

The first temperature adjustment devices 21 may be disposed in the heating zone 11 and may be located above and below the first space 110 so as to heat the first space 110 along the gravity direction (perpendicular direction) Z. In some embodiments of the present disclosure, the first temperature adjustment devices may be alternatively disposed only above or below the first space. In this embodiment, the temperature in the first space 110 heated by the first temperature adjustment devices 21 may be maintained in a constant temperature ranging from 400 degrees Celsius to 700 degrees Celsius, such as a constant temperature of 500 degrees Celsius.

The second temperature adjustment devices 22 may be disposed in the cooling zone 12 and may be located above the second space 120 so as to heat the second space 120 along the gravity direction Z. Since the second temperature adjustment devices 22 are only disposed at a side of the cooling zone 12, the temperature in the second space 120 is gradually decreased along a direction away from the second temperature adjustment devices 22, where the temperature at the second inlet 121 of the cooling zone 12 is higher than the temperature at the second outlet 122 of the cooling zone 12. It can be also considered that the second space 120 may have a high temperature area 1201 in space communication connection with the second inlet 121 and a low temperature area 1202 in space communication connection with the second inlet 121, the high temperature area 1201 is located above the low temperature area 1202 along the gravity direction Z, the temperature in the high temperature area 1201 is higher than the temperature in the low temperature area 1202, and the temperature in the second space 120 is gradually decreased from the high temperature area 1201 at the above to the low temperature area 1202 at the below along the gravity direction Z. In some embodiments of the present disclosure, the second temperature adjustment devices may be alternatively disposed at the left side, the right side or both sides of the second space, with the controlled heating temperature of the second temperature adjustment devices gradually decreased from the high temperature area at the above to the low temperature area at the below along the gravity direction, ensuring the provision of a gradual cooling environment in the second space along the gravity direction. In this embodiment, the temperature in the low temperature area 1202 of the second space 120 may be, for example, a temperature ranging from 100 degrees Celsius to 300 degrees Celsius. Preferably, the temperature in the low temperature area 1202 may be, for example, a temperature ranging from 150 degrees Celsius to 250 degrees Celsius, such as 200 degrees Celsius.

The first conveying mechanism 31 is at least partially disposed in the first space 110. Specifically, the first conveying mechanism 31 may include a transportation passage 311, a plurality of rolling parts 312 and a pushing device 313. The transportation passage 311 may be, for example, a non-actively-powered flat plate, and the transportation passage 311 extends from the first inlet 111 to the first outlet 112. The rolling parts 312 are rotatably disposed on the transportation passage 311. The rolling parts 312 are configured to support solar cell modules 7 via thermal pads 6. The pushing device 313 may be, for example, a mechanical arm, and the pushing device 313 is located out of the first space 110. In some embodiments of the present disclosure, the first conveying mechanism may be a conveyor line horizontally extending from a position outside the first space to the first outlet via the first inlet, such as a roller conveyor or a belt conveyor with a power source (e.g., a motor).

Figure 11:
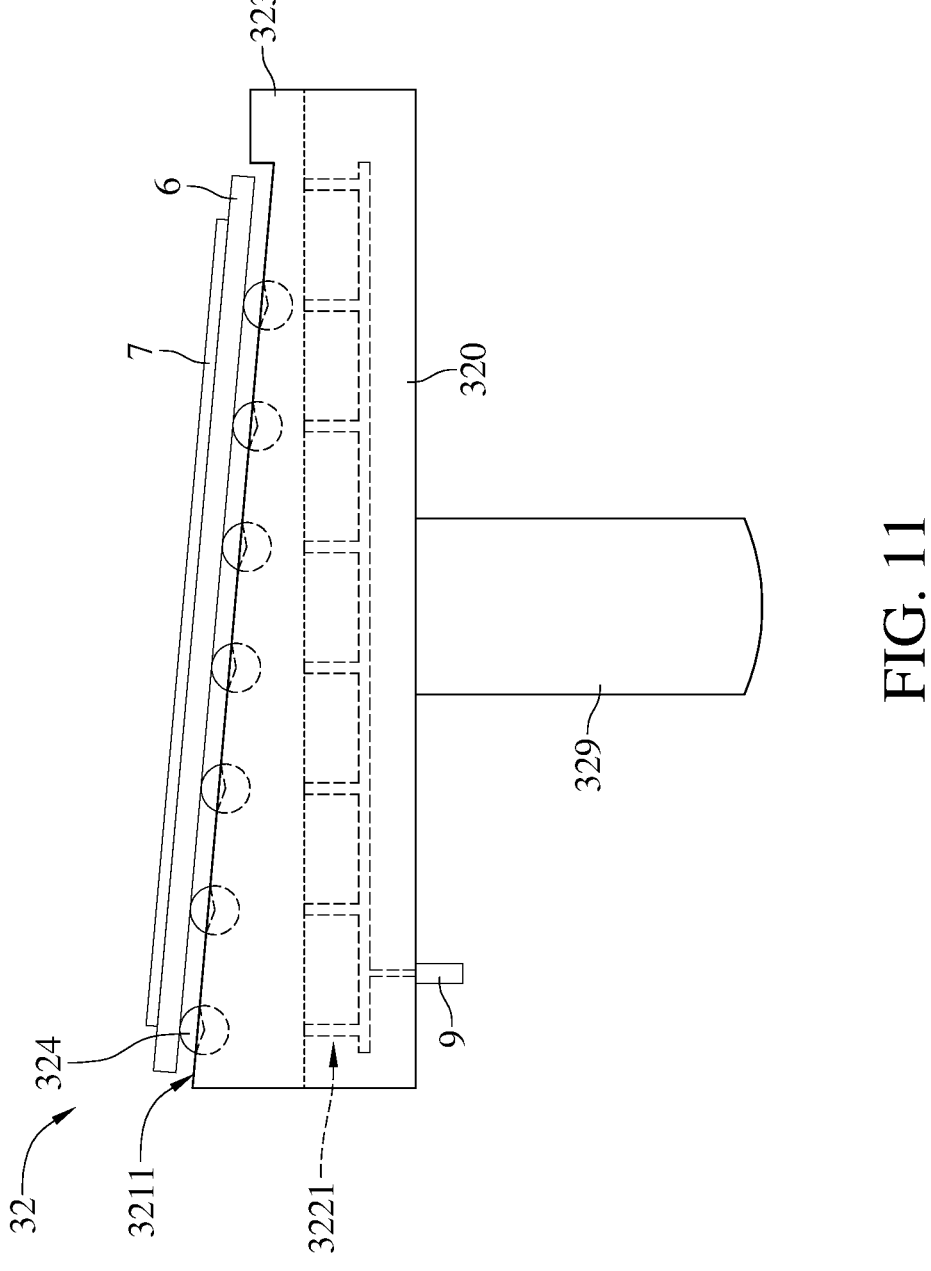
FIG. 11 to FIG. 14 are partial and enlarged view showing the actions of the thermal decomposition method in FIG. 6 to FIG. 9.
Figure 15:
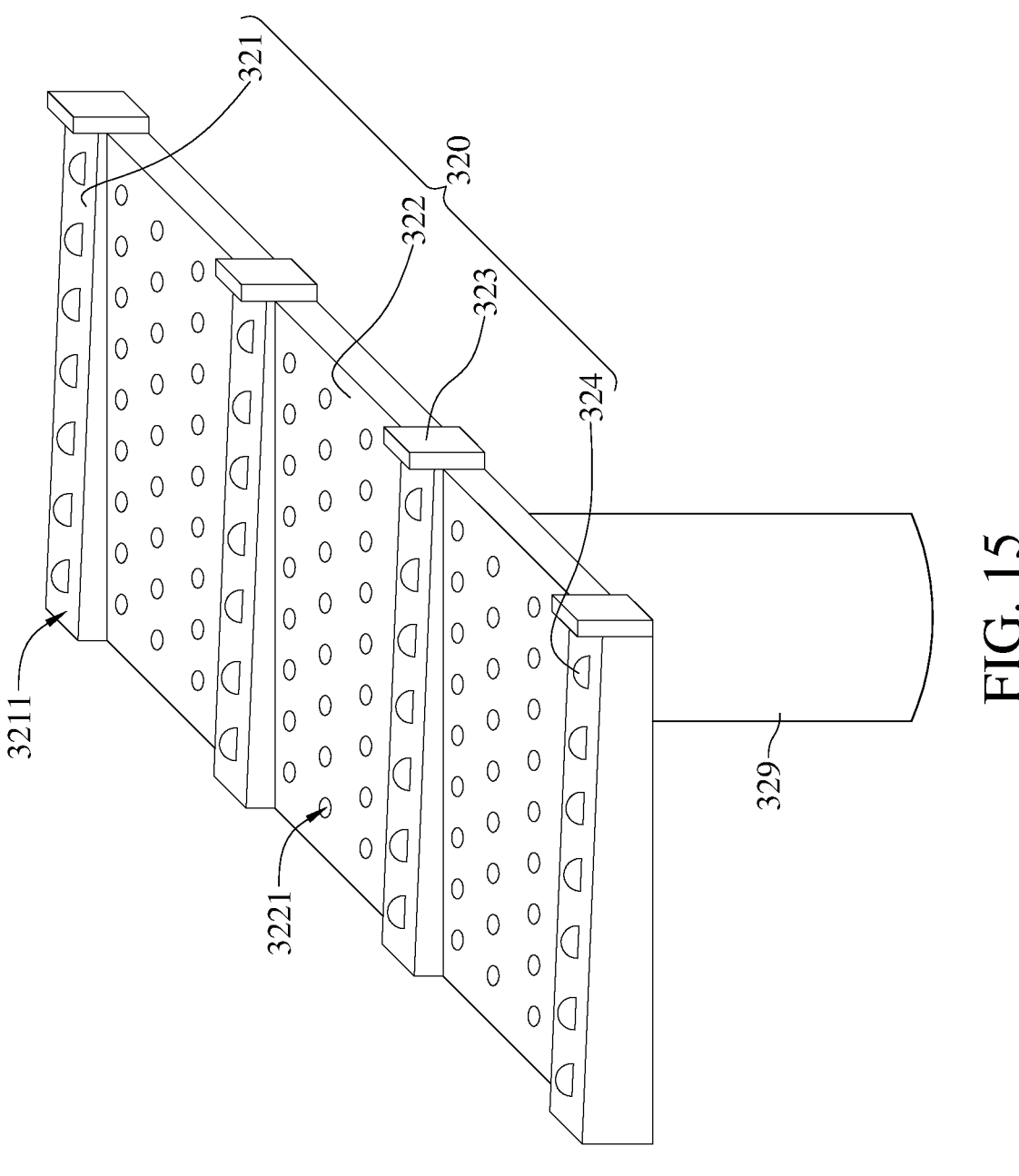
FIG. 15 is a perspective view of a second conveying mechanism according to one embodiment of the present disclosure.

The second conveying mechanism 32 may include a carrier 320 and a lifting device 329. The carrier 320 is disposed in the second space 120. Please refer to FIG. 11 and FIG. 15 together with FIG. 1, where FIG. 11 is a side view of the second conveying mechanism 32 according to one embodiment of the present disclosure, and FIG. 15 is a perspective view of the second conveying mechanism 32 according to one embodiment of the present disclosure. The carrier 320 may have a plurality of inclined parts 321, a plurality of flat parts 322, a plurality of blocking parts 323 and a plurality of rolling parts 324. The inclined parts 321 and the flat parts 322 are alternatively disposed side by side. Each inclined part 321 has an inclined surface 3211. A position of the inclined surface 3211 located close to the second inlet 121 is higher than a position of the inclined surface 3211 located close to the second outlet 122 along the gravity direction Z. Each flat part 322 has a plurality of ventilation holes 3221. The ventilation holes 3221 are adjacent to the inclined surfaces 3211 and are in space communication connection with a gas supplier (not shown) via a connection pipe 9. The blocking parts 323 are respectively disposed at positions of the inclined parts 321 close to the second outlet 122 and are located at a side of the inclined surfaces 3211. The rolling parts 324 are rotatably disposed on the inclined surfaces 3211 of the inclined parts 321. The lifting device 329 is movably disposed in the second space 120, and the lifting device 329 is connected to the carrier 320.

The third conveying mechanism 33 may be, for example, a mechanical arm, which may be disposed near the second outlet 122 of the cooling zone 12 and located out of the cooling zone 12.

The entrance gate 41 may be disposed at the first inlet 111 so as to selectively cover the first inlet 111, such that the heat in the first space 110 can be prevented from being dissipated and thus the temperature therein can be prevented from being deviated from the setting value.

The middle gate 42 may be disposed between the first inlet 111 and the first outlet 112 so as to selectively and partially separate the first space 110, such that the temperature in the first space 110 can be maintained at the setting value.

The partition gate 43 is disposed between the heating zone 11 and the cooling zone 12 so as to selectively enable the space communication connection between the first outlet 112 and the second inlet 121, such that a good temperature controlling of the first temperature adjustment devices 21 and the second temperature adjustment devices 22 respectively to the heating zone 11 and the cooling zone 12 can be ensured.

The exit gate 44 may be disposed at the second outlet 122 so as to selectively cover the second outlet 122, such that the heat in the second space 120 can be prevented from being dissipated and thus the temperature therein can be prevented from being deviated from the setting value.

The exhausting pipes 51 may be disposed to the heating zone 11 and the cooling zone 12 and in space communication connection with the first space 110 and the second space 120, such that the gas generated therein during thermal decomposition of the solar cell module(s) 7 can be drawn out.

According to one embodiment of the present disclosure, the thermal pad 6 may be, for example, a graphene plate or a silicon carbide plate with good thermal conductivity, or may be, for example, a hollow metal plate or ceramic plate with gas flow channel (not shown) therein. With the characteristic of good thermal conductivity of the thermal pad 6, the temperature across the entire supporting surface of the thermal pad 6 can be maintained consistent, such that a solar cell module 7 on the supporting surface of the thermal pad 6 can have uniform temperature distribution. Moreover, the glass plate of the solar cell module 7 can be securely placed on the supporting surface of the thermal pad 6, such that the integrity of the cooled down glass plate can be ensured.

According to one embodiment of the present disclosure, the solar cell module 7 includes the glass plate and other components such as cell plates (not shown). The cell plates and the glass plate are adhered to each other through sealing adhesive, with conductive ribbons welded on the cell plates, wherein the sealing adhesive may be made by, for example, ethylene vinyl acetate (EVA). One or more solar cell modules 7 can be placed into the thermal decomposition apparatus 1 so as to obtain one or more intact glass plates from the decomposed solar cell modules 7. Moreover, the glass plates may have different thicknesses depending on different types of the solar cell modules 7. In general, the glass plate with a common thickness from the decomposed solar cell modules 7 in various types can keep intact without crack during the cooling process as long as the temperature difference between any two points on the surface of the glass plate are maintained equal to or less than 15 degrees Celsius.

In the following, the process of obtaining a glass plate decomposed from the solar cell module 7 placed into the thermal decomposition apparatus 1 will be illustrated. Please refer to FIG. 2 to FIG. 10 and FIG. 20, where FIG. 2 to FIG. 10 are schematic views showing actions of a thermal decomposition method performed by the thermal decomposition apparatus 1 in FIG. 1, and FIG. 20 is a flow chart of a thermal decomposition method according to one embodiment of the present disclosure.

Firstly, in the step S101, the entrance gate 41, the middle gate 42 and the partition gate 43 are opened, and the exit gate 44 is closed, as shown in FIG. 1.

Then, in the step S102, as shown in FIG. 1, solar cell modules 7 to be decomposed are placed on the thermal pads 6 with glass plates thereof facing downwards, and the thermal pads 6 are placed on the rolling parts 312 of the first conveying mechanism 31.

Figure 2:
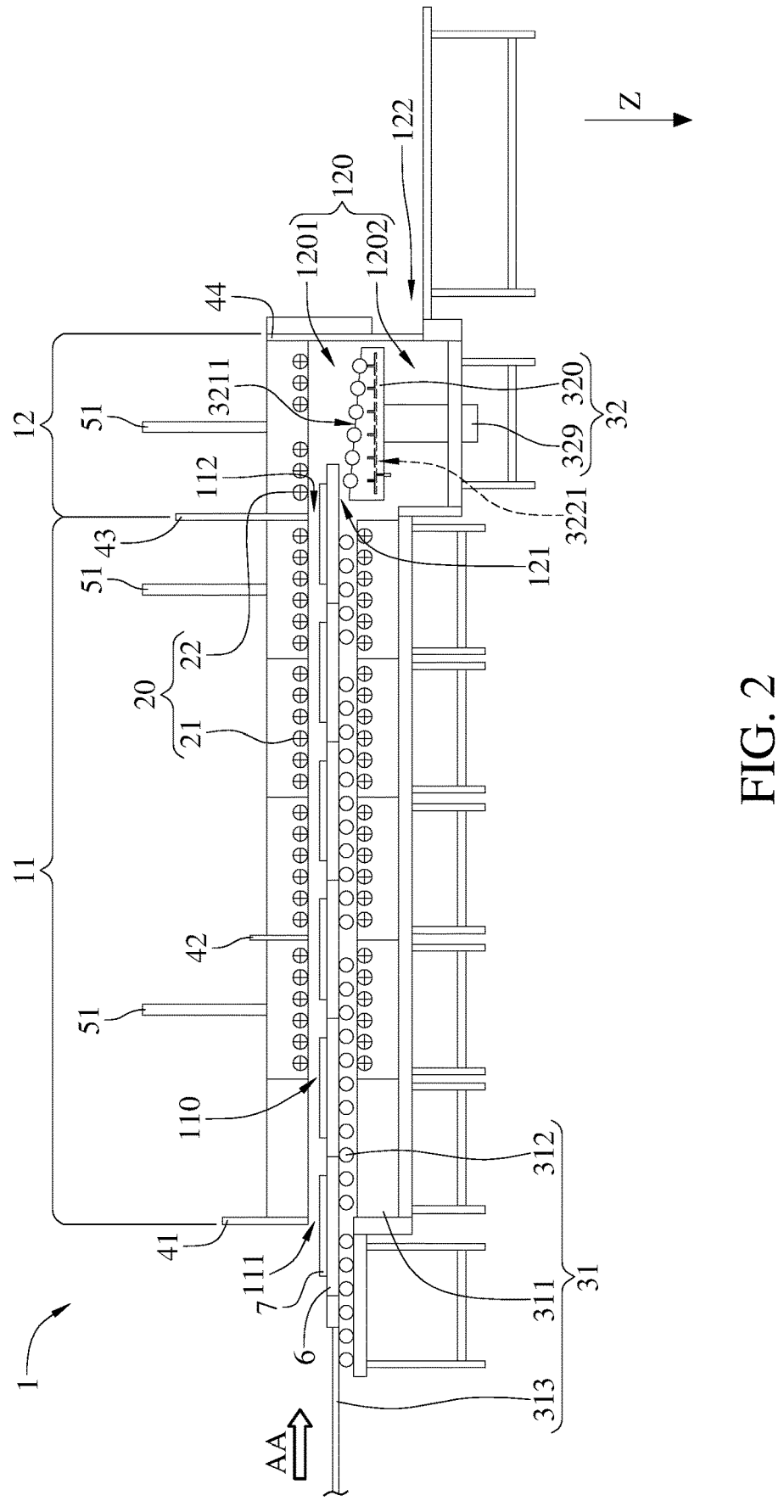
FIG. 2 to FIG. 10 are schematic views showing actions of a thermal decomposition method performed by the thermal decomposition apparatus in FIG. 1.
Figure 3:
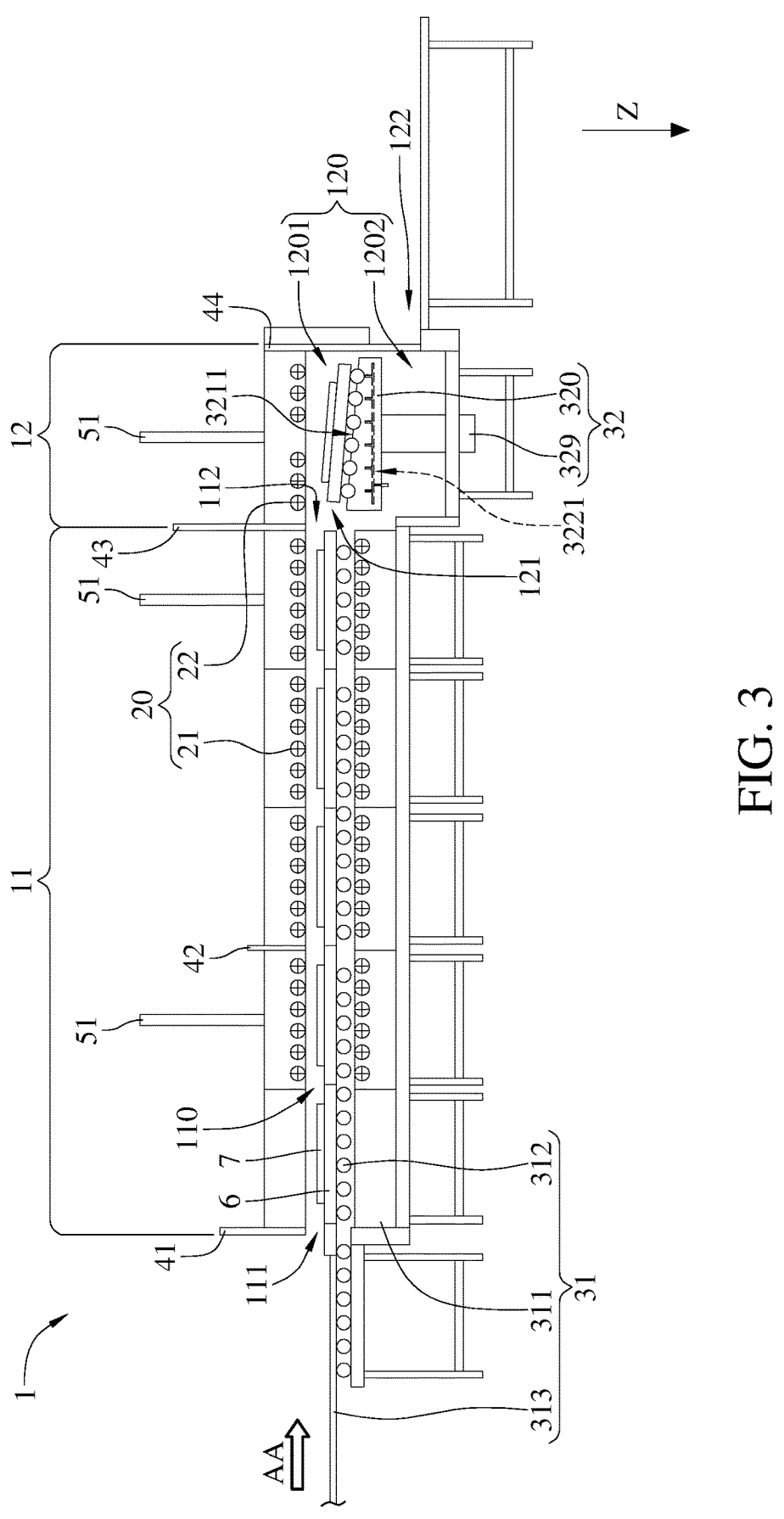

Then, in the step S103, as denoted by the arrow AA in FIG. 2 and FIG. 3, the pushing device 313 sequentially pushes thermal pads 6 and solar cell modules 7 thereon into the first space 110 via the first inlet 111 one by one, so that the solar cell modules 7 can be moved into the heating zone 11 to be heated. As shown in FIG. 2, the thermal pads 6 in the first space 110 are arranged side by side, and therefore one thermal pad 6 and one solar cell module 7 thereon located at outside can be pushed into the first space 110 by the pushing device 313 so as to indirectly push other thermal pads 6 along with other solar cell modules 7 thereon that are already heated in the first space 110 along a direction from the first inlet 111 to the first outlet 112.

In this embodiment, the solar cell modules 7 experience briefly pause in the first space 110 between every pushing exerted by the pushing device 313, and the movement of the solar cell modules 7 in the first space 110 is intermittently interrupted several times. This intentional interruption of movement ensures adequate heating of the solar cell modules 7, such that the first space 110 can be designed compact, thereby conserving space utilization of the heating zone 11.

The solar cell modules 7 are heated at both upper and lower sides thereof during the movement thereof in the first space 110, such that the temperature of each solar cell module 7 is gradually increased to be substantially the same as the temperature within the first space 110. By doing so, the sealing adhesive of each solar cell module 7 can be decomposed into gas due to high temperature, and the generated gas caused by the decomposition can be drawn out via the exhausting pipe 51. Complete decomposition of the sealing adhesive of each solar cell module 7 occurs before the solar cell module 7 reaches the first outlet 112, which may typically take about 30 to 120 minutes. Moreover, the high temperature results in disconnection between the conductive ribbons and the cell plates of each solar cell module 7 as their welded joints weaken. Consequently, the cell plates and the conductive ribbons are left unfixed on the glass plate of the solar cell module 7.

Please be noted that only one thermal pad 6 and its accompanying solar cell module 7 will be illustrated for convenience description in the following, but the present disclosure is not limited thereto. In the step S104, the thermal pad 6 and the solar cell module 7 are continuously pushed to a position on the carrier 320 via the second outlet 122 after they are pushed out of the heating zone 11 via the first outlet 112, as shown in FIG. 2. In the present disclosure, since the temperature at the first outlet 112 is substantially the same as that at the second inlet 121, the glass plate of the solar cell module 7 can be prevented from being cracked due to an excessively large temperature difference when moving from the first outlet 112 to the second inlet 121.

Then, in the step S105, the thermal pad 6 and the solar cell module 7 are slid down along the inclined surfaces 3211 of the inclined parts 321 and the rolling parts 324 disposed on the inclined surfaces 3211 until blocked by the blocking parts 323, as shown in FIG. 3 with reference to FIG. 11 and FIG. 15. Please be noted that the blocking parts 323 are not intended to restrict the present disclosure. In some embodiments of the present disclosure, there may be no blocking part, and partial existing or additional disposed ventilation holes can be used to provide a suction force to fix the thermal pad and the solar cell module on the inclined surfaces. In some embodiments of the present disclosure, the suction degrees through the ventilation holes may be different; for example, the closer to the second outlet, the stronger the suction degree through the ventilation hole is. In some other embodiments of the present disclosure, the blocking parts may be replaced by suction cups.

Figure 4:
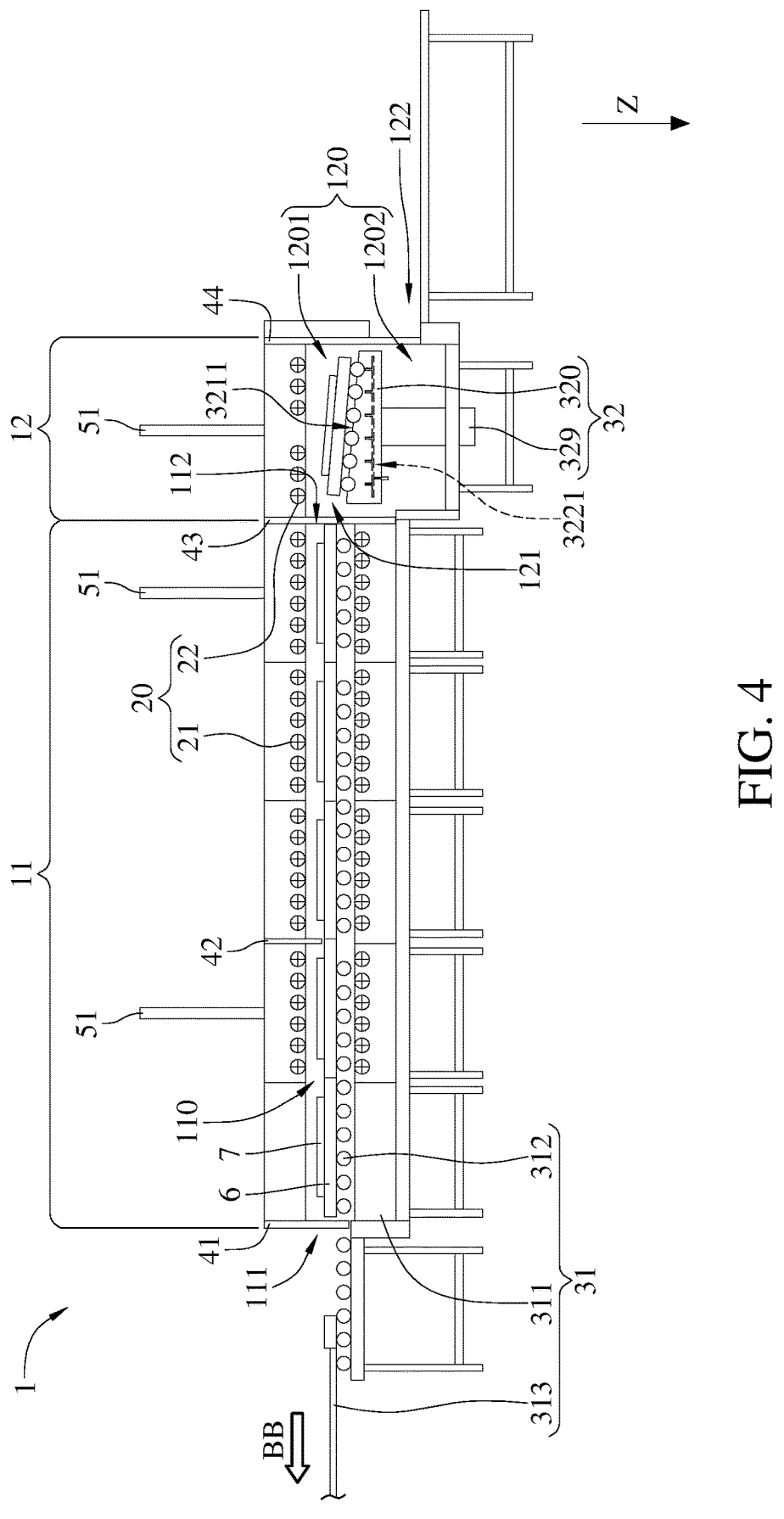

Then, in the step S106, as shown in FIG. 4, the pushing device 313 is moved out of the first space 110 along the arrow BB, and then the entrance gate 41, the middle gate 42 and the partition gate 43 are closed.

Figure 5:
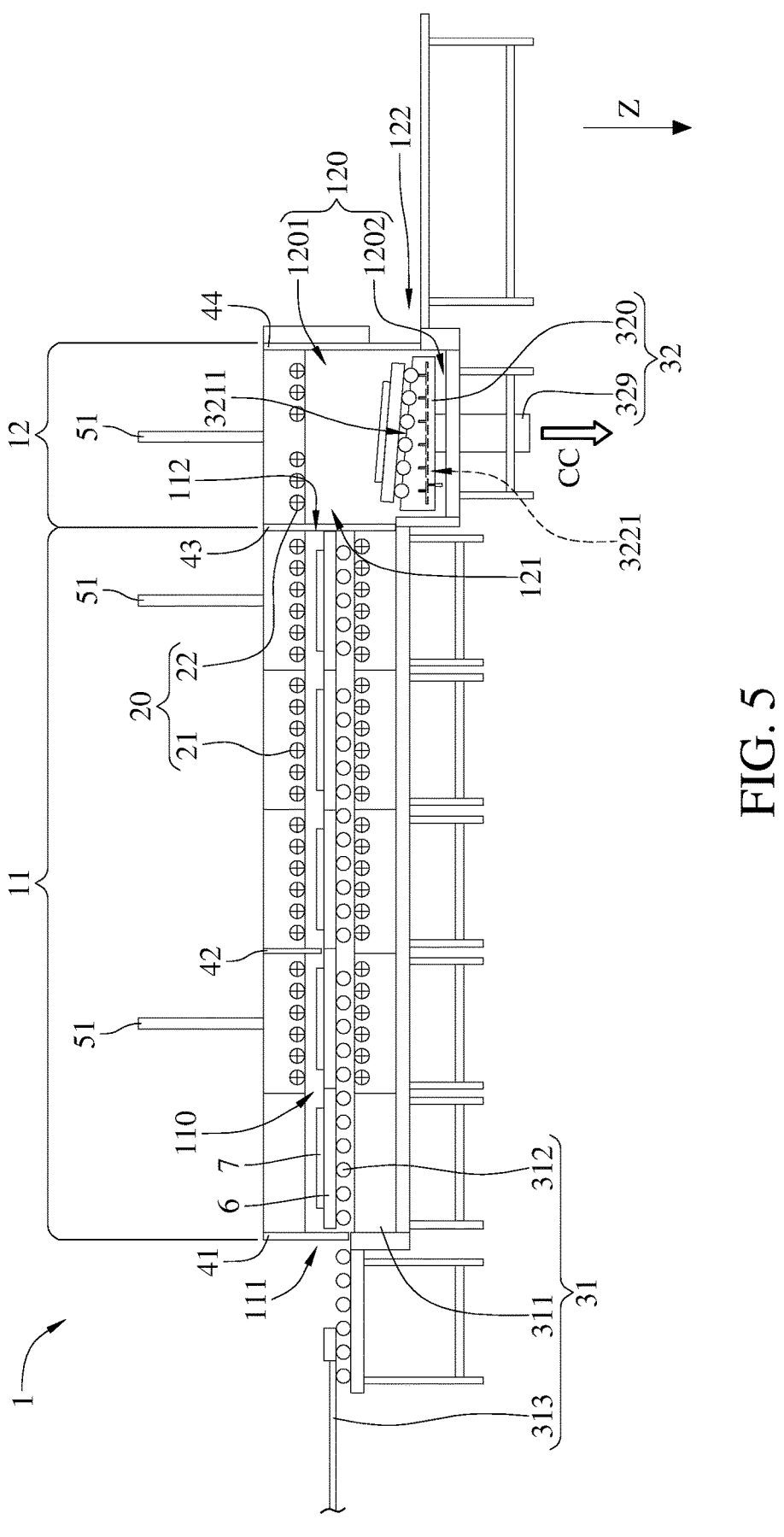

Then, in the step S107, as denoted by the arrow CC in FIG. 5, the lifting device 329 is lowered down with the carrier 320 thereon, so that the thermal pad 6 and the solar cell module 7 on the carrier 320 can be moved from the high temperature area 1201 to the low temperature area 1202 and then reaches the vicinity of the second outlet 122. Please further refer to FIG. 11, during the movement of the thermal pad 6 and the solar cell module 7 in the vicinity of the second outlet 122, the step S108 is performed simultaneously. In the step S108, airflow from the gas supplier is provided to the thermal pad 6 via the connection pipe 9 and the ventilation holes 3221. As such, the solar cell module 7 can be gradually cooled down through the gradual cooling environment in the second space 120 along the gravity direction and the characteristic of good thermal conductivity of the thermal pad 6. Consequently, the solar cell module 7 can be cooled down to a temperature as the same as that in the low temperature area 1202. It can be also considered that the carrier 320 is configured to move the solar cell module 7 from the second inlet 121 to the second outlet 122 through the inclined surfaces 3211, and the carrier 320 is configured to provide airflow to the thermal pad 6 so as to cool down the solar cell module 7.

During the movement of the solar cell module 7 from the high temperature area 1201 to the low temperature area 1202, the solar cell module 7 benefits from being within a gradually cooled environment regulated by the second temperature adjustment device 22. Moreover, the ventilation holes 3221 enable airflow towards the thermal pad 6, facilitating efficient heat dissipation from the solar cell module 7 through contact with the thermal pad 6. This ensures the uniform and efficient cooling of the solar cell module 7, thereby enhancing a consistent temperature distribution across its entire surface. As such, the temperature difference between any two points on the entire surface of the glass plate of the solar cell module 7 can be kept equal to or less than 15 degrees Celsius, mitigating the risk of glass plate crack caused by disparate cooling rates. The present disclosure can provide a vertical and quick cooling design to significantly conserve space utilization and working time of the thermal decomposition apparatus 1, and the power consumption can also be reduced due to shortened working time.

Please further refer to FIG. 11 to FIG. 14, which are partial and enlarged view showing the actions of the thermal decomposition method in FIG. 6 to FIG. 9.

As shown in FIG. 6, in the step S109, the exit gate 44 is opened.

Figure 7:
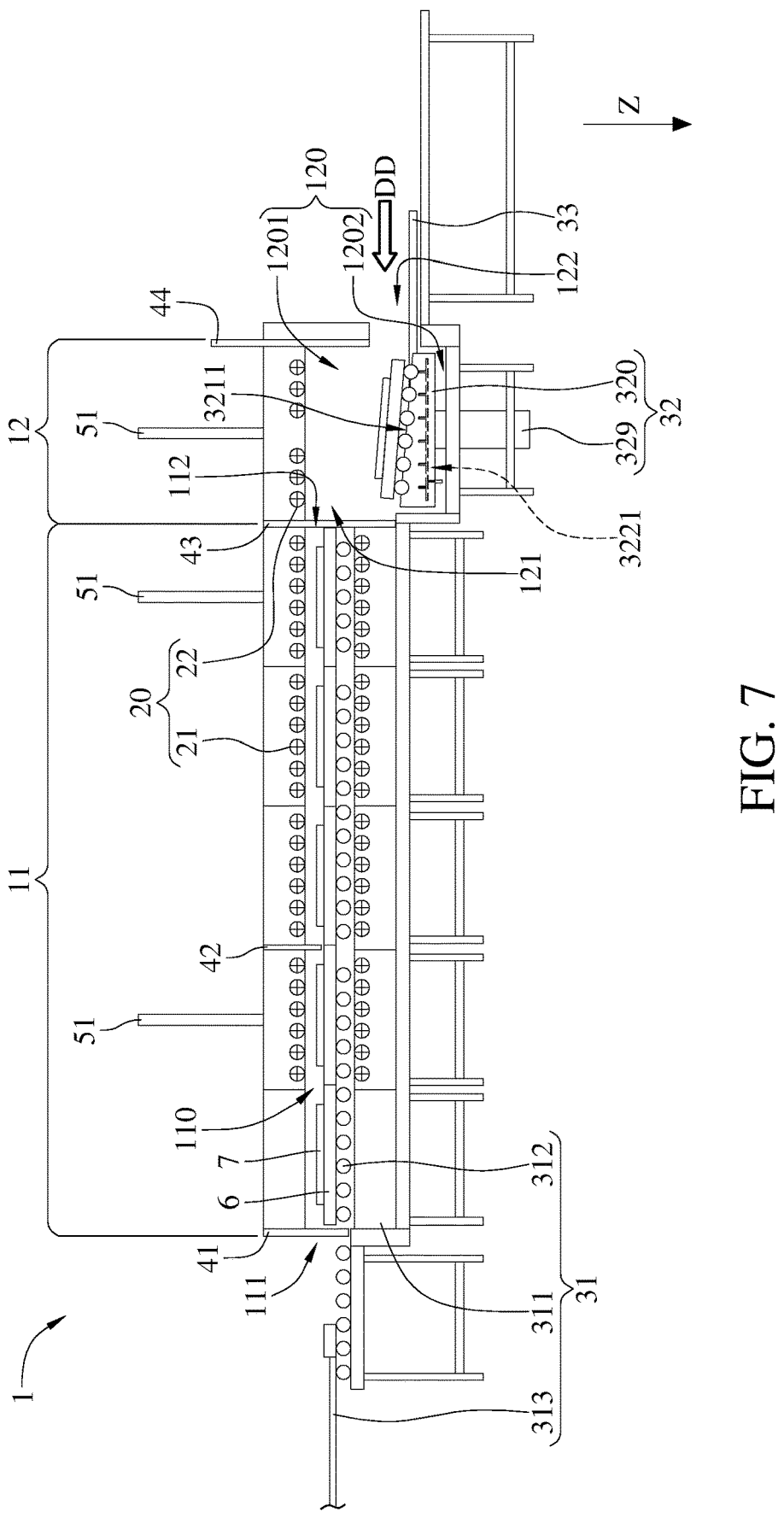
Figure 12:
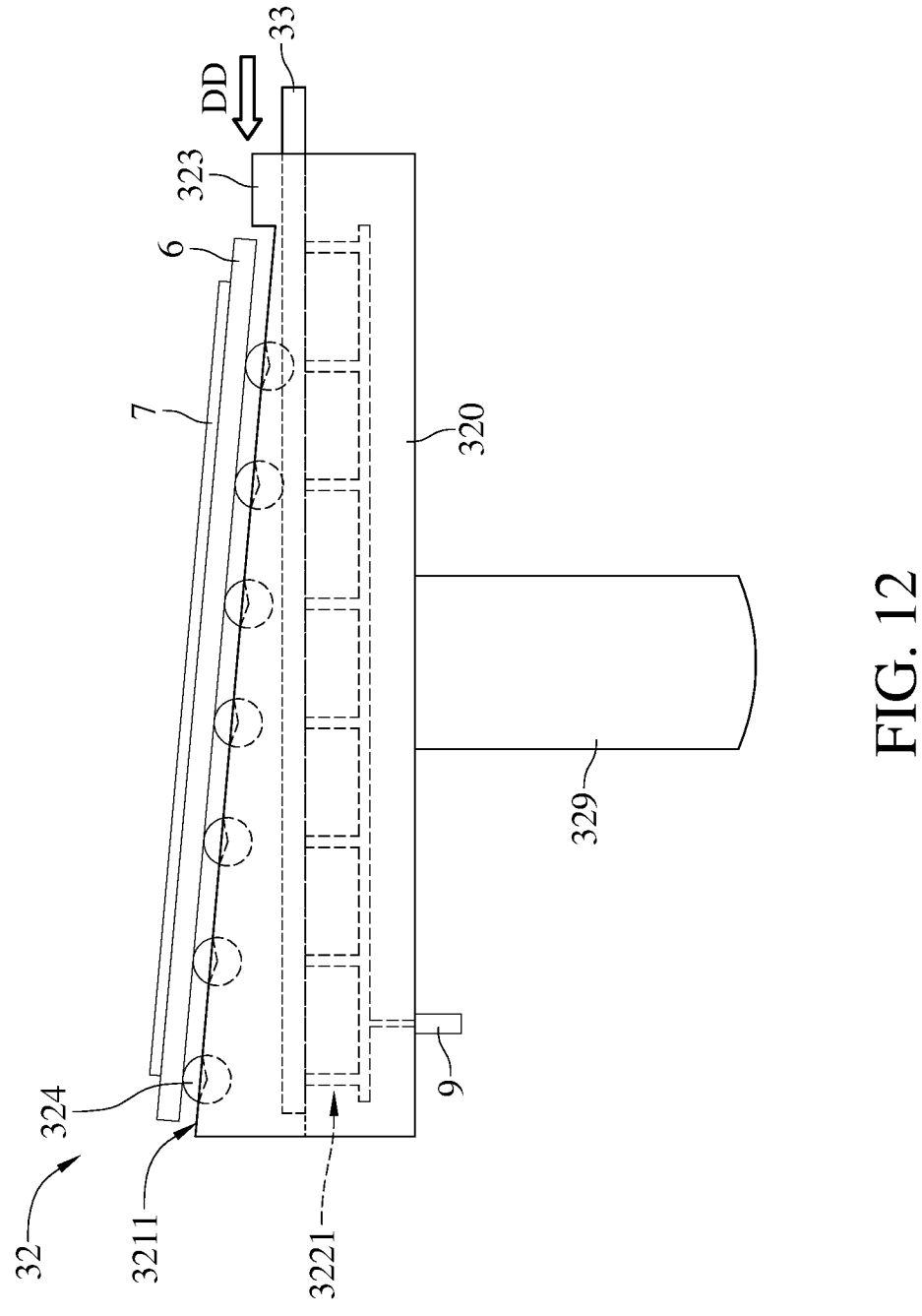

Then, in the step S110, as denoted by the arrow DD in FIG. 6, FIG. 7 and FIG. 12, the third conveying mechanism 33 is moved to the flat parts 322 so as to be located below the thermal pad 6 and the solar cell module 7.

Figure 8:
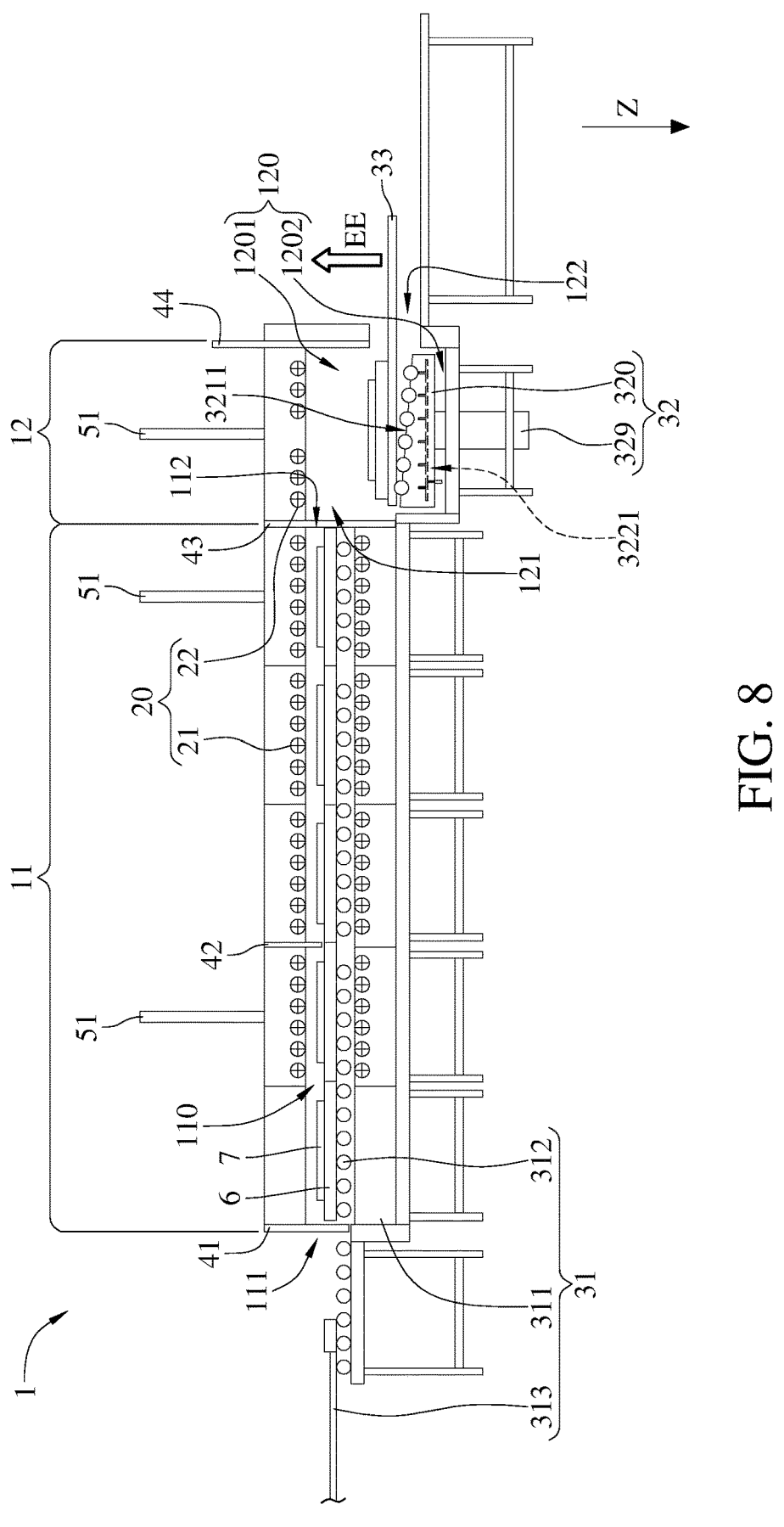
Figure 13:
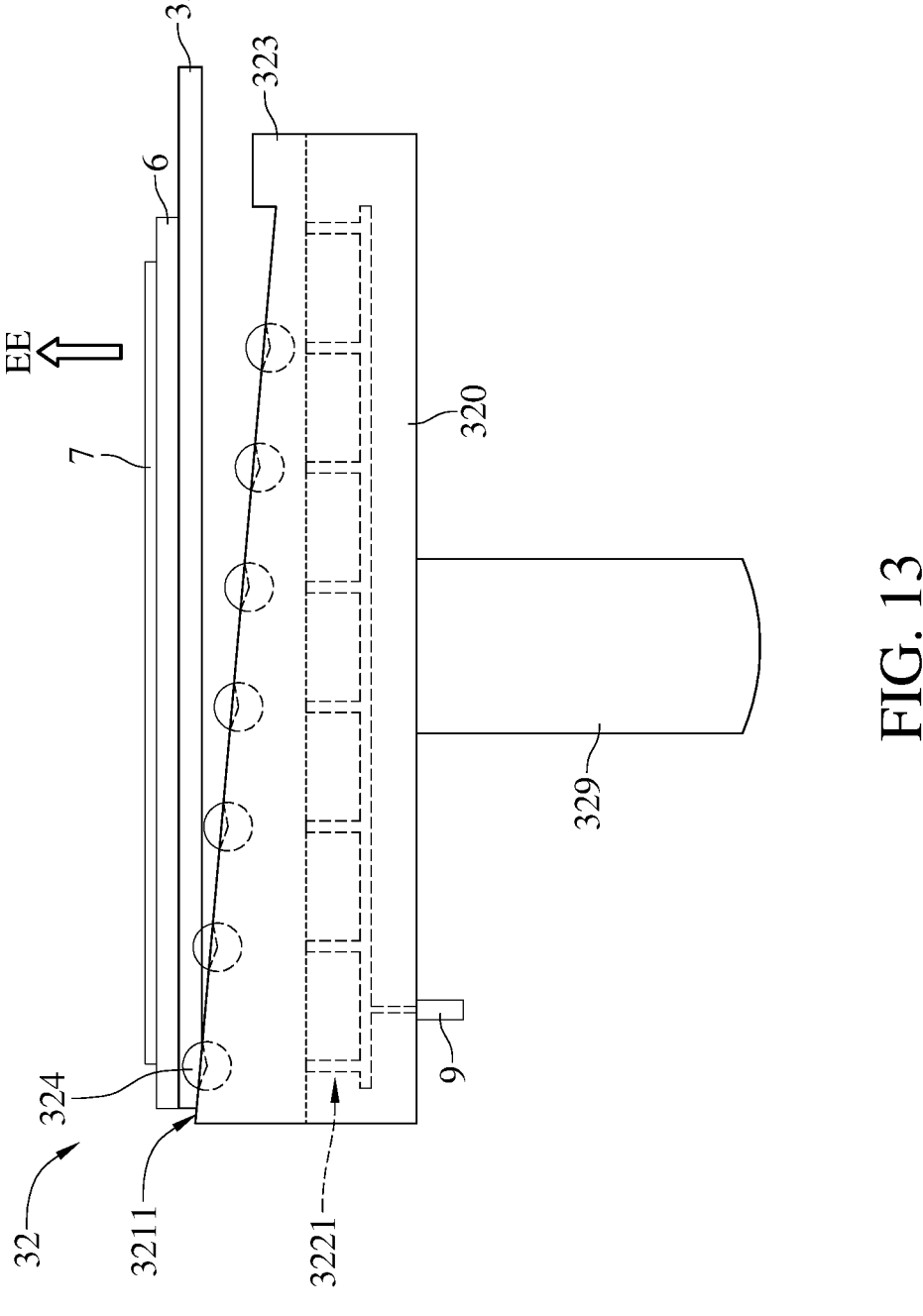

Then, in the step S111, as denoted by the arrow EE in FIG. 8 and FIG. 13, the third conveying mechanism 33 is lifted, and the thermal pad 6 and the solar cell module 7 are transferred on the third conveying mechanism 33.

Figure 9:
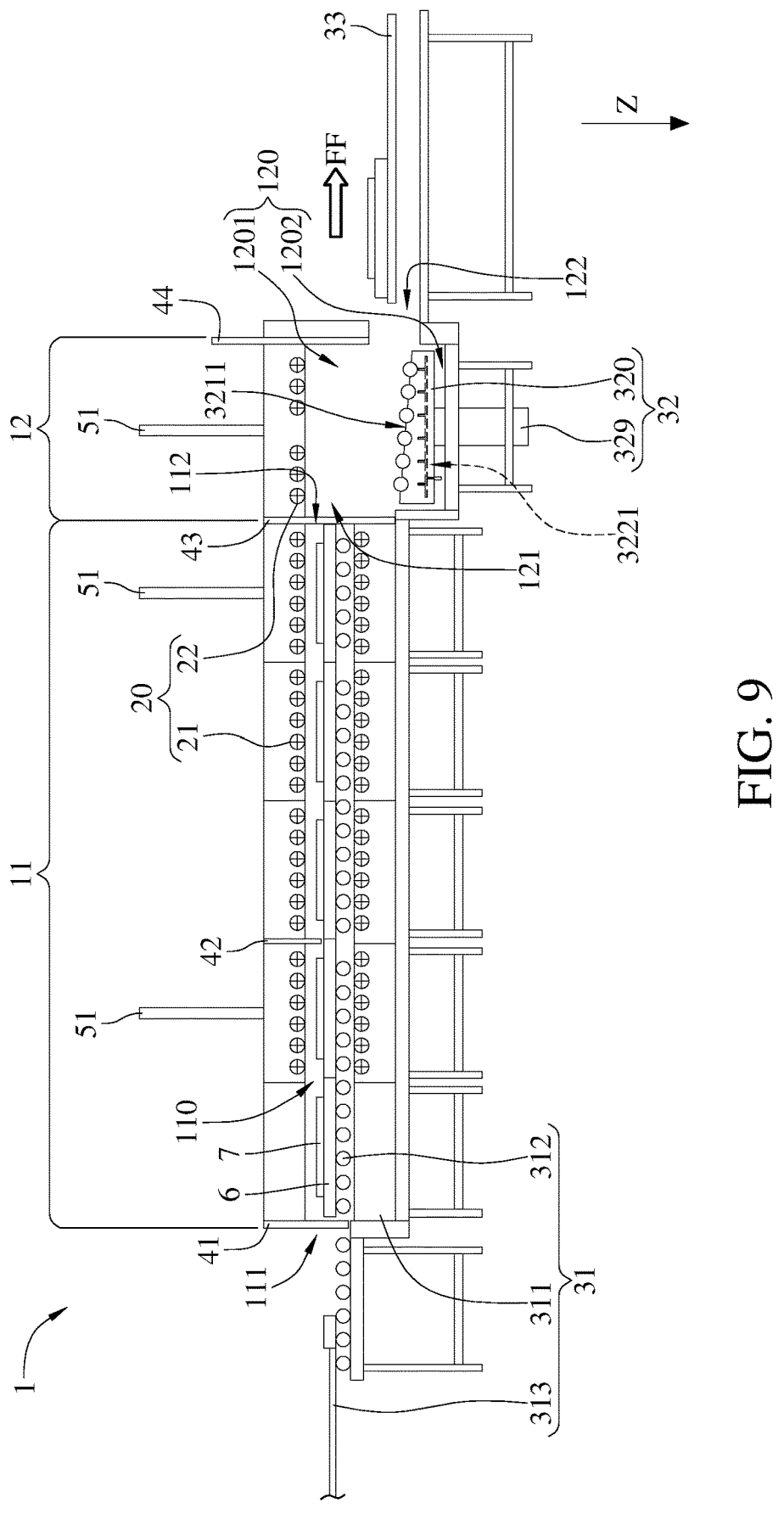
Figure 14:
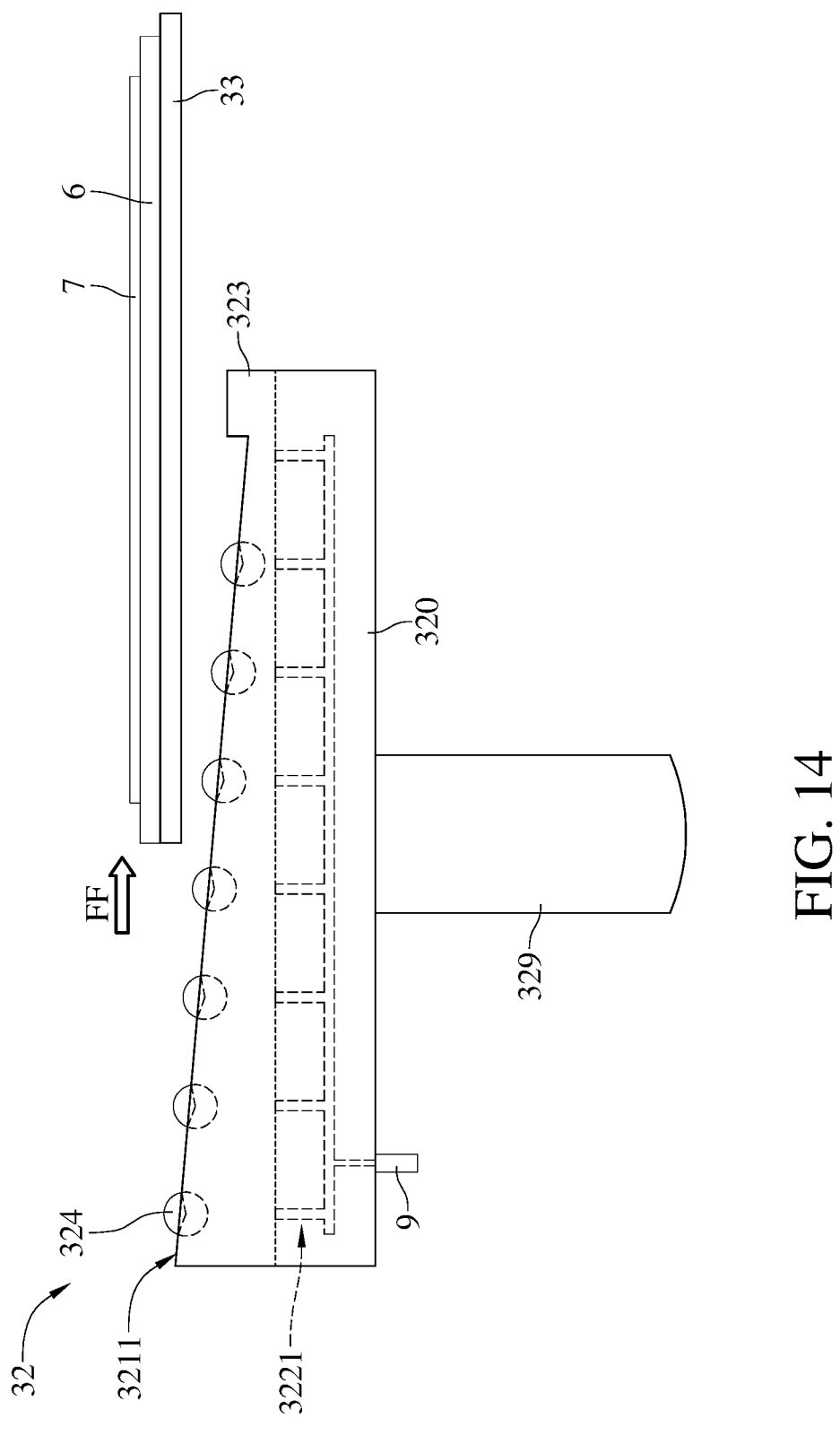

Then, in the step S112, as denoted by the arrow FF in FIG. 9 and FIG. 14, the thermal pad 6 and the solar cell module 7 are together moved out of the cooling zone 12 by the third conveying mechanism 33.

Figure 10:
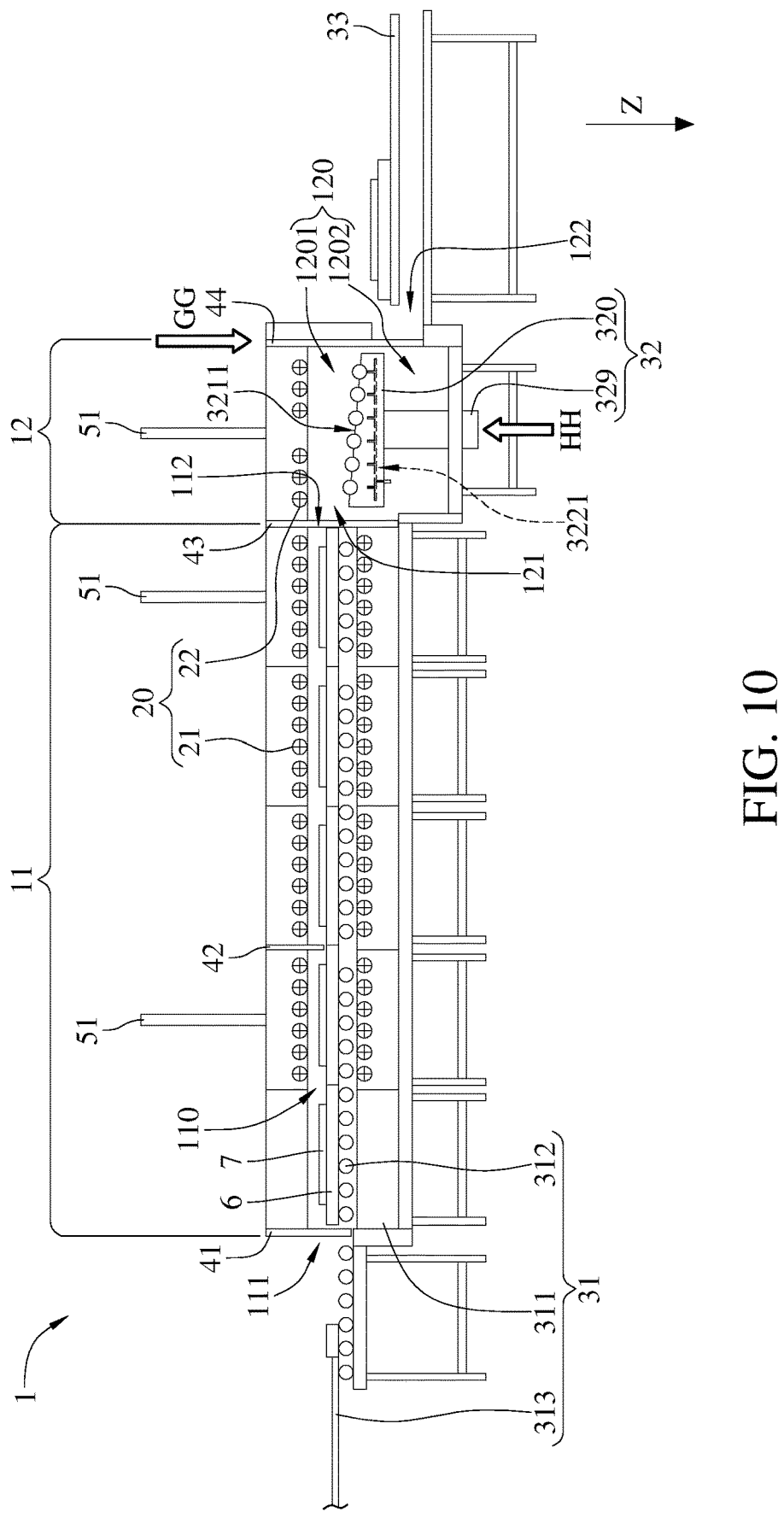

Then, in the step S113, as denoted by the arrows GG and HH in FIG. 10, the exit gate 44 is closed and the lifting device 329 is lifted, so that the carrier 320 returns to its original position, as shown in FIG. 1.

With the design of the ventilation holes 3221 of the carrier 320, the accuracy of cooling the solar cell module 7 can be further properly controlled by adjusting the intensity and duration of airflow. Further, with the design of the inclined surfaces 3211 of the carrier 320, the thermal pad 6 and the solar cell module 7 can be slid down along the inclined surfaces 3211 to facilitate the convenient closure of the partition gate 43, which effectively interrupts thermal convection between the first space 110 and the second space 120. As such, the temperature controls of the first temperature adjustment device 21 and the second temperature adjustment device 22 respectively to the first space 110 and the second space 120 remain independent from each other, thereby ensuring the gradient temperature distribution in the cooling zone 12 regulated by the second temperature adjustment device 22. Furthermore, the design of the flat parts 322 of the carrier 320 facilitates the removal of the thermal pad 6 and the solar cell module 7 by the third conveying mechanism 33, which simplifies the movement path design of the second conveying mechanism 32 and the third conveying mechanism 33. Moreover, the presence of a single carrier 320 in the cooling zone 12 enhances the accurate control over the cooling process for the solar cell module 7. Please be noted that the use of only one carrier 320 in the cooling zone 12 is not intended to restrict the present disclosure. In some embodiments of the present disclosure, the lifting device may be connected to a plurality of carriers arranged adjacently.

In the abovementioned embodiment, the high temperature area 1201 is designed to be located above the low temperature area 1202 along the gravity direction Z, such that the hot gas generated from the thermal decomposition can naturally rise upwards due to the principle of thermal convection so as to be accumulated at the top region of the cooling zone 12.

This facilitates the extraction of the hot gas via the exhausting pipe 51 without affecting the temperature of the low temperature area 1202 at the below. However, the present disclosure it not limited thereto. In some embodiments of the present disclosure, provided that the hot gas generated from the thermal decomposition can be timely drawn out, the high temperature area may be designed to be located below the low temperature area.

In some embodiments of the present disclosure, the solar cell module may be vertically transported in the heating zone, as long as the gas generated from the decomposition of the sealing adhesive can be timely extracted for preventing any generated gas from the decomposition naturally rising due to the principle of thermal convection from affecting the decomposition of the solar cell module located at the above along the gravity direction.

Please be noted that the arrangement of three flat parts 322 each located between adjacent two of four inclined parts 321 in the second conveying mechanism 32, as depicted in FIG. 15, is not intended to restrict the present disclosure.

Figure 16:
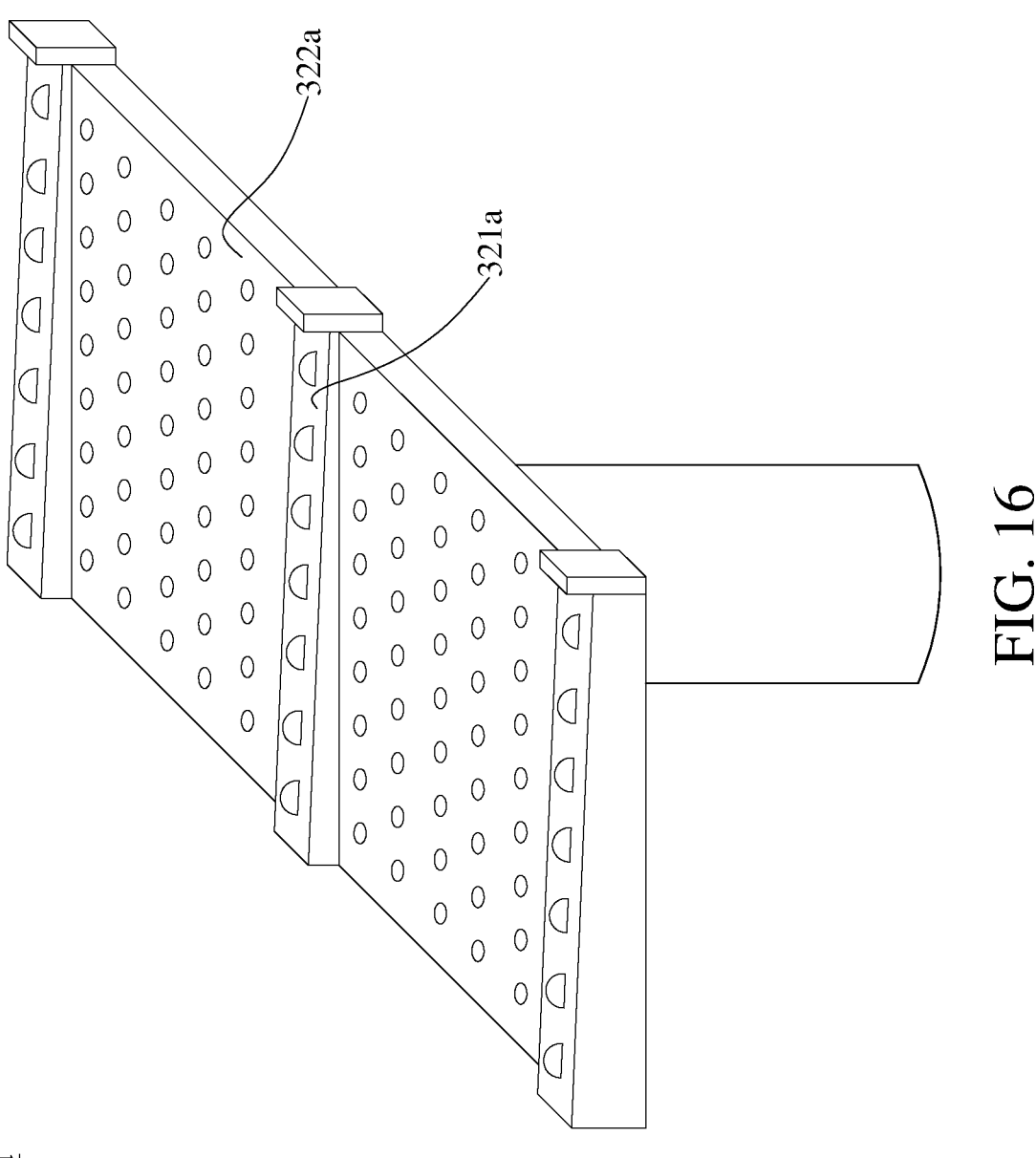
FIG. 16 is a perspective view of a second conveying mechanism according to another embodiment of the present disclosure.

Please refer to FIG. 16, which is a perspective view of a second conveying mechanism 32a according to another embodiment of the present disclosure. Please be noted that only difference between this and previous embodiments, as well as related description, will be illustrated hereinafter. In this embodiment, the second conveying mechanism 32a includes three inclined parts 321a and two flat parts 322a each located between adjacent two of the inclined parts 321a.

Figure 17:
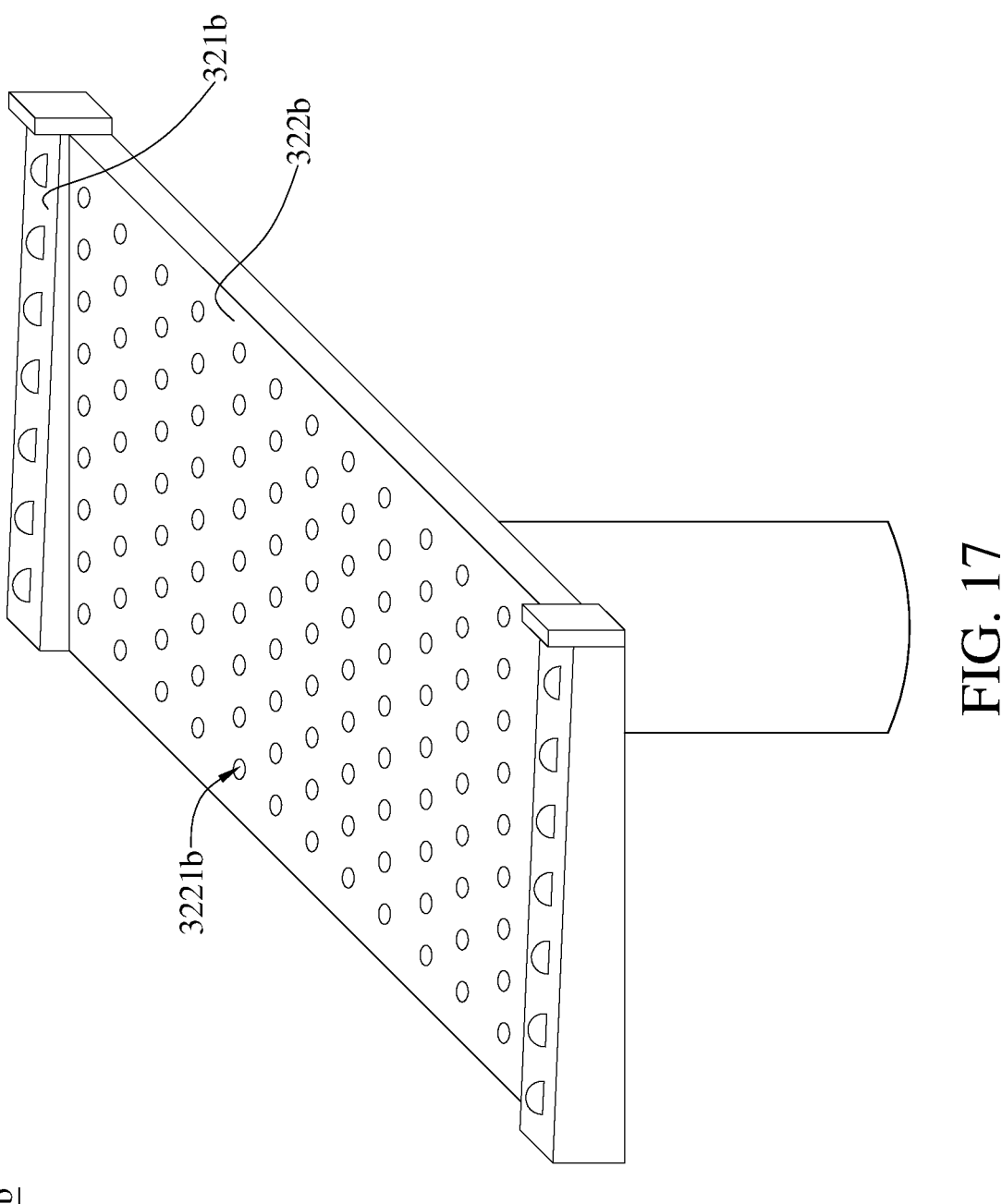
FIG. 17 is a perspective view of a second conveying mechanism according to further another embodiment of the present disclosure.

Please refer to FIG. 17, which is a perspective view of a second conveying mechanism 32b according to further another embodiment of the present disclosure. Please be noted that only difference between this and previous embodiments, as well as related description, will be illustrated hereinafter. In this embodiment, the second conveying mechanism 32b includes two inclined parts 321b and one flat part 322b located between adjacent two of the inclined parts 321b.

Figure 18:
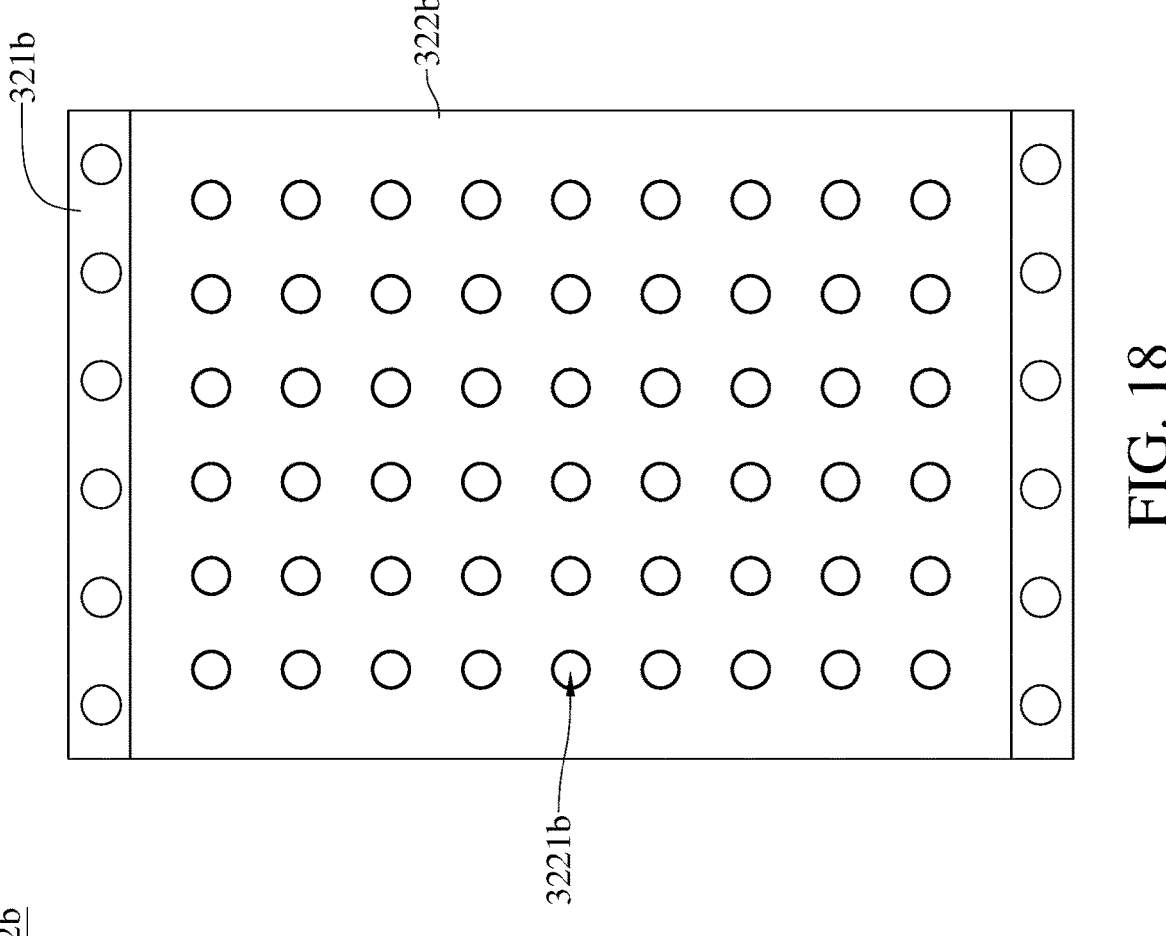
FIG. 18 is a top view of a carrier of the second conveying mechanism in FIG. 17.

Please be noted that the arrangement of alignment of the ventilation holes 3221b in parallel to the extension direction of the inclined parts 321b in the second conveying mechanism 32b, as depicted in FIG. 17 as well as in the top view of FIG. 18, is not intended to restrict the present disclosure.

Figure 19:
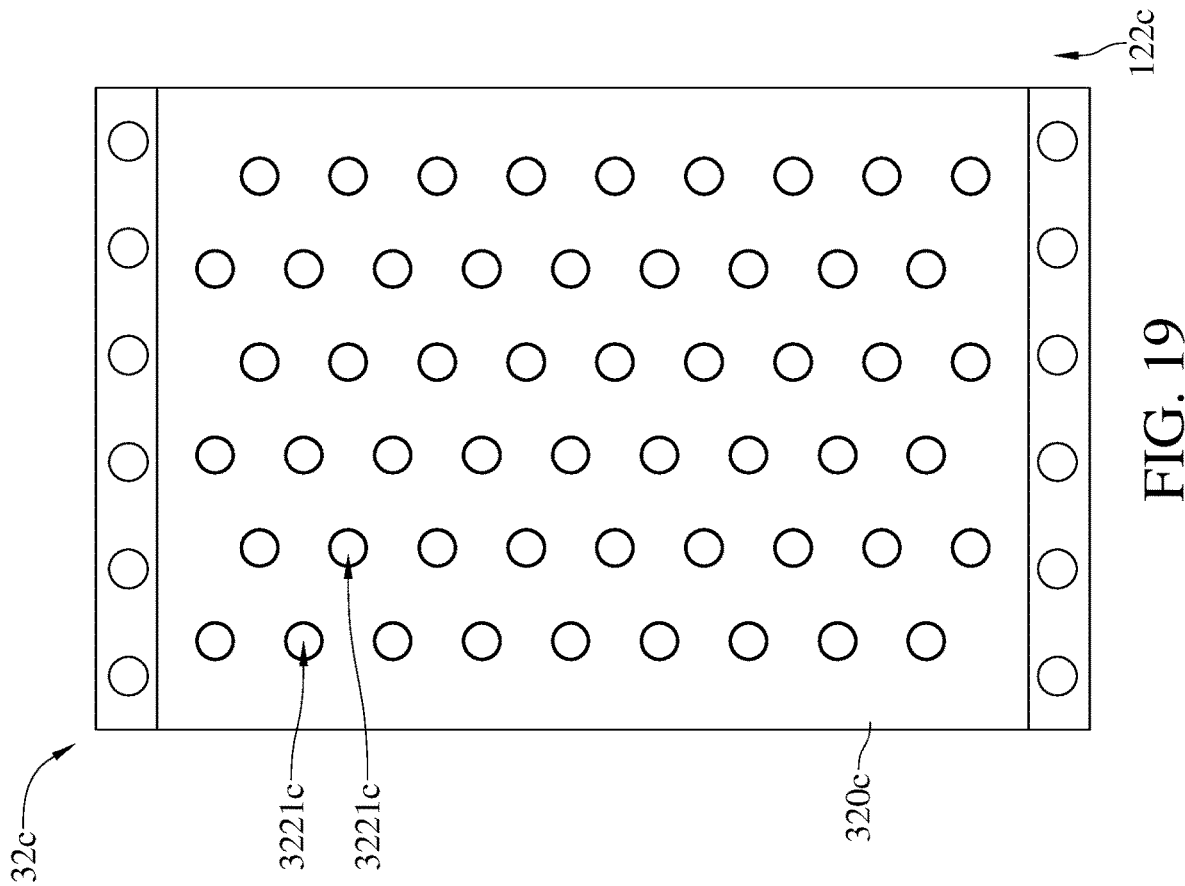
FIG. 19 is a top view of a carrier according to still further another embodiment of the present disclosure.

Please refer to FIG. 19, which is a top view of a carrier 320c according to still further another embodiment of the present disclosure. Please be noted that only difference between this and previous embodiments, as well as related description, will be illustrated hereinafter. In this embodiment, the ventilation holes 3221c of the second conveying mechanism 32c are arranged along a plurality of rows. The distances between the rows and the second outlet 122c are different, and the ventilation holes 3221c in two adjacent rows are misaligned.

According to the thermal decomposition apparatus and the thermal decomposition method applying the same discussed above, during the movement of the solar cell module from the high temperature area to the low temperature area, the solar cell module benefits from being within a gradually cooled environment regulated by the second temperature adjustment device. Moreover, the ventilation holes enable airflow towards the solar cell module, facilitating efficient heat dissipation from the solar cell module. This ensures the uniform and efficient cooling of the solar cell module, thereby enhancing a consistent temperature distribution across its entire surface. As such, the temperature difference between any two points on the entire surface of the glass plate of the solar cell module can be kept equal to or less than 15 degrees Celsius, mitigating the risk of glass plate crack caused by disparate cooling rates. The present disclosure can provide a vertical and quick cooling design to significantly conserve space utilization and working time of the thermal decomposition apparatus, and the power consumption can also be reduced due to shortened working time.

Additionally, with the design of the ventilation holes of the carrier, the accuracy of cooling the solar cell module can be further properly controlled by adjusting the intensity and duration of airflow. Further, with the design of the inclined surfaces of the carrier, the thermal pad and the solar cell module can be slid down along the inclined surfaces to facilitate the convenient closure of the partition gate, which effectively interrupts thermal convection between the first space and the second space. As such, the temperature controls of the first temperature adjustment device and the second temperature adjustment device respectively to the first space and the second space remain independent from each other, thereby ensuring the gradient temperature distribution in the cooling zone regulated by the second temperature adjustment device. Furthermore, the design of the flat parts of the carrier facilitates the removal of the thermal pad and the solar cell module by the third conveying mechanism, which simplifies the movement path design of the second conveying mechanism and the third conveying mechanism. Moreover, the presence of a single carrier in the cooling zone enhances the accurate control over the cooling process for the solar cell module.

Figure 21:
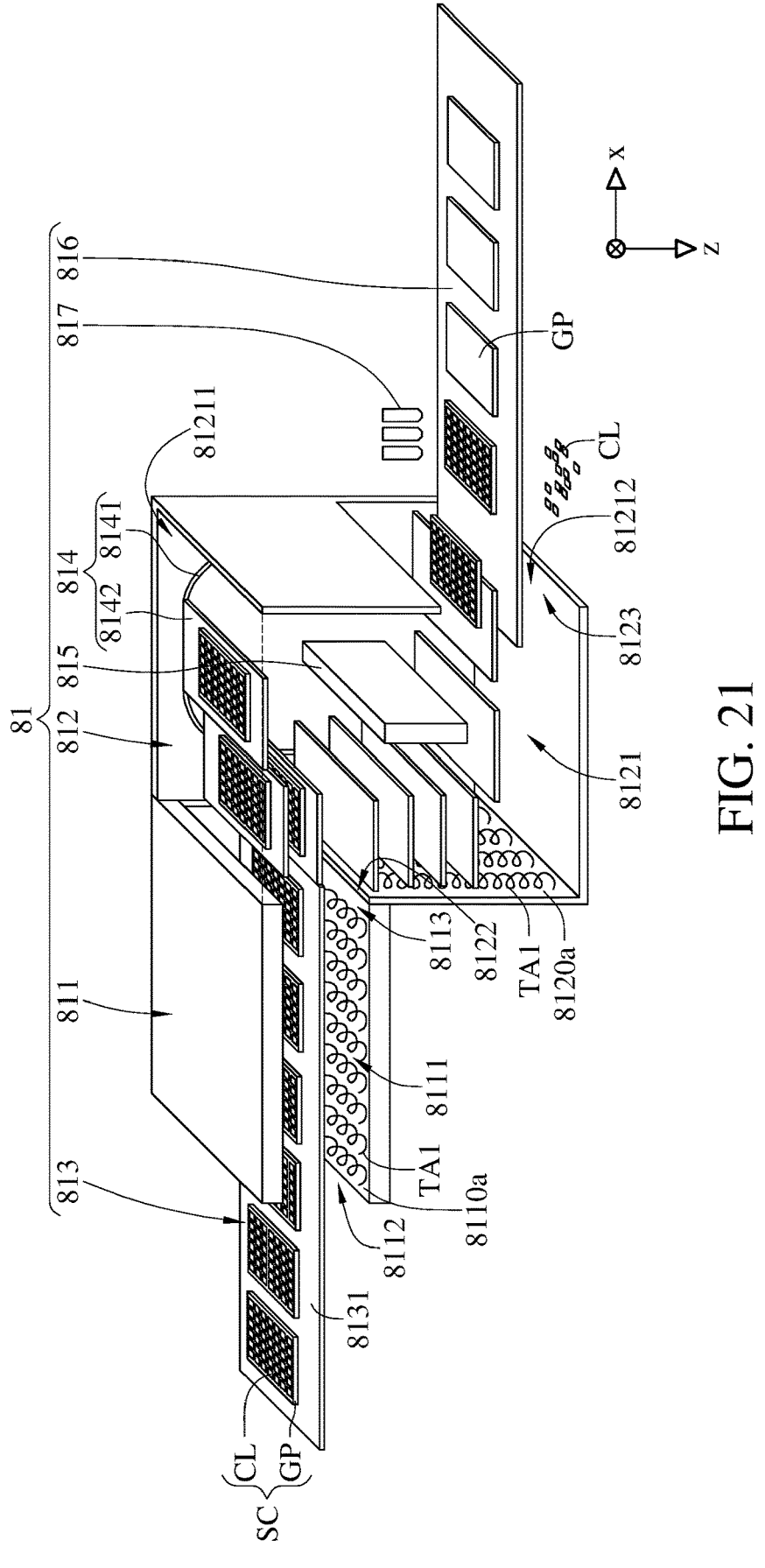
FIG. 21 is a perspective view of a thermal decomposition apparatus configured to decompose solar cell modules according to still further another embodiment of the present disclosure.
Figure 22:
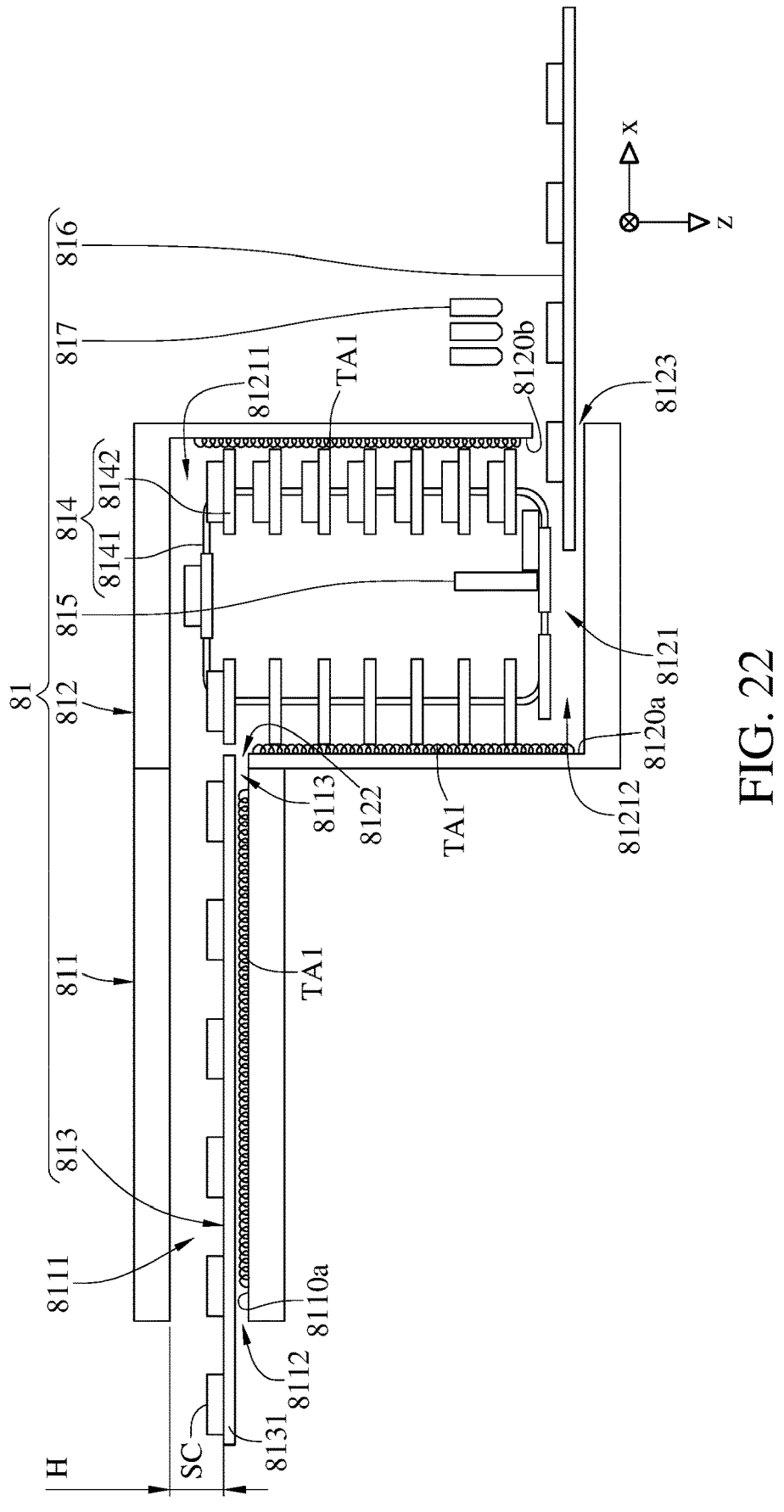
FIG. 22 is a side view of the thermal decomposition apparatus with solar cell modules in FIG. 21.

Please refer to FIG. 21 and FIG. 22, where is a perspective view of a thermal decomposition apparatus 81 configured to decompose solar cell modules SC according to still further another embodiment of the present disclosure, and FIG. 22 is a side view of the thermal decomposition apparatus 81 with solar cell modules SC in FIG. 21. Please be noted that some lateral walls of the thermal decomposition apparatus 81 are omitted in the drawings of the present disclosure for clearly showing inner structures of the thermal decomposition apparatus 81.

The thermal decomposition apparatus 81 provided in still further another embodiment of the present disclosure can be used to decompose at least one solar cell module SC through high temperature, so that glass plate(s) of the solar cell module SC can be completely separated.

The thermal decomposition apparatus 81 may include a heating zone 811, a heat-preserving zone 812, a first conveying mechanism 813, a second conveying mechanism 814, a blocker 815, a third conveying mechanism 816 and a removal device 817.

The heating zone 811 has a first space 8111, a first inlet 8112 and a first outlet 8113 that are in space communication connection with one another. The first inlet 8112 and the first outlet 8113 are located at two opposite sides of the first space 8111 along a horizontal direction X. The heating zone 811 includes a plurality of first temperature adjustment devices TA1 (e.g., infrared heaters or resistive heaters) disposed on the lower wall 8110a below the first space 8111 so as to heat the first space 8111 along a vertical direction (the gravity direction Z). In some embodiments of the present disclosure, the first temperature adjustment devices may be disposed on the upper wall above the first space or both the upper and lower walls at the above and below of the first space. Moreover, the heating temperature of the first temperature adjustment devices TA1 to the first space 8111 may be maintained in a constant temperature ranging from 400 degrees Celsius to 700 degrees Celsius, such as a constant temperature of 500 degrees Celsius. Moreover, the opening of the heating zone 811 at the first inlet 8112 may have a height H ranging from 3 centimeters to 10 centimeters, such as 5 centimeters, so that the heat in the first space 8111 is prevented from being dissipated out via the first inlet 8112.

The heat-preserving zone 812 has a second space 8121, a second inlet 8122 and a second outlet 8123 that are in space communication connection with one another. The second space 8121 has a high temperature area 81211 and a low temperature area 81212 that are in space communication connection with each other, and the high temperature area 81211 is located above the low temperature area 81212 along the gravity direction Z. The temperature in the high temperature area 81211 is higher than the temperature in the low temperature area 81212. Specifically, the heat-preserving zone 812 includes a plurality of first temperature adjustment devices TA1 that may be, for example, disposed on the lateral walls 8120a and 8120b at the left and right sides of the second space 8121. The heating temperature of the first temperature adjustment devices TA1 to the second space 8121 is gradually decreased from the high temperature area 81211 at the above to the low temperature area 81212 at the below along the gravity direction Z. As such, a gradual cooling environment along the gravity direction Z can be provided in the second space 8121. Moreover, the second inlet 8122 is in space communication connection with the high temperature area 81211, and the second outlet 8123 is in space communication connection with the low temperature area 81212. Therefore, it can be also considered that the temperature of the heat-preserving zone 812 at the second inlet 8122 is higher than the temperature of the heat-preserving zone 812 at the second outlet 8123. Moreover, the second inlet 8122 is in space communication connection with the first outlet 8113 of the heating zone 811, and the temperature at the second inlet 8122 of the heat-preserving zone 812 is substantially equal to the temperature at the first outlet 8113 of the heating zone 811. In the present disclosure, the substantial equality between the temperature at the second inlet 8122 and the temperature at the first outlet 8113 refers that the temperature difference between the second inlet 8122 and the first outlet 8113 is, for example, equal to or less than 15 degrees Celsius. As such, the glass plate GP of the solar cell module SC to be carried can be prevented from being cracked due to an overly large temperature difference. Further, the temperature at the high temperature area 81211 of the second space 8121 may be substantially equal to the temperature at the first space 8111; the temperature at the low temperature area 81212 of the second space 8121 may be a temperature ranging from 100 degrees Celsius to 300 degrees Celsius, or a preferable temperature ranging from 150 degrees Celsius to 250 degrees Celsius, or an exemplary temperature as being 200 degrees Celsius, for example.

The first conveying mechanism 813 is at least partially disposed in the first space 8111. Specifically, the first conveying mechanism 813 may be a conveyor line 8131 which horizontally extends from a position outside the first space 8111 to the first outlet 8113 via the first inlet 8112 with a supporting surface (not numbered) thereof substantially in parallel with the extending direction (the horizontal direction X). The conveyor line 8131 may be, for example, a roller conveyor or a belt conveyor with power, in which the power may be provided by a power source (e.g., a motor) included in the conveyor line 8131 for rolling the rollers of the roller conveyor or transporting the belt of the belt conveyor or may be provided by the gravity of an object supported on the conveyor line 8131 which is a roller conveyor arranged in an inclined manner with the rollers thereof being rolled by the supported object.

The second conveying mechanism 814 may be disposed in the second space 8121. Specifically, the second conveying mechanism 814 includes a track 8141 and a plurality of thermal pads 8142. The track 8141 is disposed in the second space 8121, and the path of the track 8141 passes a position adjacent to the second inlet 8122 and a position adjacent to the second outlet 8123. The thermal pads 8142 are movably disposed on the track 8141. The supporting area of each thermal pad 8142 may be larger than an area of the solar cell module SC to be supported. The thermal pads 8142 may be, for example, graphene plates or silicon carbide plates with good thermal conductivity, or may be, for example, hollow metal plates with gas flow channel (not shown) therein. With the characteristic of good thermal conductivity of the thermal pads 8142, the temperature across the entire supporting surface of each thermal pad 8142 can be maintained consistent, such that the solar cell module SC to be supported on the supporting surface of each thermal pad 8142 can have uniform temperature distribution. Please be noted that the quantity of the thermal pad in some embodiments of the present disclosure may be single, and the present disclosure is not limited thereto.

The blocker 815 may be disposed in the low temperature area 81212 of the second space 8121 and is located in the vicinity of the moving path of the thermal pads 8142 adjacent to the second outlet 8123.

The third conveying mechanism 816 may also be a conveyor line, for example, a non-actively-powered roller conveyor with gaps existing between rollers (not shown) thereof. The third conveying mechanism 816 may be horizontally disposed through the second outlet 8123 of the heat-preserving zone 812. The third conveying mechanism 816 has one end located in the second space 8121 and the other end located out of the second space 8121.

The removal device 817 may be an air gun that can eject a high pressure airstream, and the removal device 817 may be disposed above the third conveying mechanism 816 to eject airstream towards the third conveying mechanism 816.

According to still further another embodiment of the present disclosure, the solar cell module SC includes the glass plate GP and other components such as cell plates CL. The cell plates CL and the glass plate GP are adhered to each other through sealing adhesive (not shown), with conductive ribbons (not shown) welded on the cell plates CL, wherein the sealing adhesive may be made by, for example, ethylene vinyl acetate (EVA). One or more solar cell modules SC can be placed into the thermal decomposition apparatus 81 so as to obtain one or more intact glass plates GP from the decomposed solar cell modules SC. Moreover, the glass plates GP may have different thicknesses depending on different types of the solar cell modules SC. In general, the glass plate GP with a common thickness from the decomposed solar cell modules SC in various types can keep intact without crack during the cooling process as long as the temperature difference between any two points on the surface of the glass plate GP are maintained equal to or less than 15 degrees Celsius. Please be noted that the solar cell modules SC mentioned herein do not include aluminum frames, junction boxes and encapsulation backplanes.

In the following, the process of obtaining a glass plate GP decomposed from the solar cell module SC placed into the thermal decomposition apparatus 81 will be illustrated.

Firstly, a solar cell module SC can be placed on the conveyor line 8131 at a position adjacent to the first inlet 8112 and outside the first space 8111, with its glass plate GP facing downwards and supported by the conveyor line 8131. The solar cell module SC can be transferred into the first space 8111 and then to the first outlet 8113 along the horizontal direction X by the conveyor line 8131. The solar cell module SC is heated at both upper and lower sides thereof during the movement thereof in the first space 8111, such that the temperature of the solar cell module 7 is gradually increased to be substantially the same as the same as the temperature within the first space 8111. By doing so, the sealing adhesive of the solar cell module SC can be decomposed into gas due to high temperature. Complete decomposition of the sealing adhesive of the solar cell module SC occurs before the solar cell module SC reaches the first outlet 8113, which may typically take about 30 to 120 minutes. Moreover, the high temperature results in disconnection between the conductive ribbons and the cell plates CL of the solar cell module SC as their welded joints weaken. Consequently, the cell plates CL and the conductive ribbons are left unfixed on the glass plate GP of the solar cell module SC.

Then, the solar cell module SC is transferred into the second space 8121 via the first outlet 8113 and the second inlet 8122 so as to be carried by a thermal pad 8142 therein. The solar cell module SC carried by the thermal pad 8142 can be transferred as the movement of the thermal pad 8142 along the track 8141 from the high temperature area 81211 to the low temperature area 81212 of the second space 8121 in the gravity direction Z. During the movement of the solar cell module SC from the high temperature area 81211 to the low temperature area 81212, the solar cell module SC can undergo a gradual cooling process. This gradual cooling process prevents a rapid temperature drop, allowing the solar cell module SC to gently reach a temperature substantially equal to that of the low temperature area 81212.

As set forth, the heating temperature of the first temperature adjustment devices TA1 to the second space 8121 is gradually decreased from the high temperature area 81211 to the low temperature area 81212 along the vertical direction (the gravity direction Z). The arrangement of the first temperature adjustment devices TA1 along the lateral sides of the solar cell module SC (along the horizontal direction X) facilitates the gradual cooling process, which can preserve the heat within the solar cell module SC from rapid dissipation during the movement from the high temperature area 81211 to the low temperature area 81212. This ensures the uniform cooling of the solar cell module SC, thereby enhancing a consistent temperature distribution across its entire surface. As such, the temperature difference between any two points on the entire surface of the glass plate GP of the solar cell module SC can be kept equal to or less than 15 degrees Celsius, mitigating the risk of glass plate GP crack caused by disparate cooling rates. Moreover, the cooling process can be further intensified to result in a greater temperature decreasing from the high temperature area 81211 to the low temperature area 81212, as long as the glass plate GP can maintain uniform cooling, which can enhance the efficiency of the cooling process. The present disclosure can provide a vertical and quick cooling design to significantly conserve space utilization and working time of the thermal decomposition apparatus 81, and the power consumption can also be reduced due to shortened working time. Moreover, the glass plate GP of the solar cell module SC can be securely placed on the supporting surface of the thermal pad 8142, such that the integrity of the cooled down glass plate GP can be ensured.

Then, the movement of the thermal pad 8142 in the vicinity of the second outlet 8123 within the low temperature area 81212 causes the abutting of the blocker 815 against the solar cell module SC supported on the thermal pad 8142, which facilitates the transfer of the solar cell module SC from the thermal pad 8142 to the third conveying mechanism 816. Then, the solar cell module SC can be moved out of the second space 8121 via the second outlet 8123 by the third conveying mechanism 816. During the movement of the solar cell module SC by the third conveying mechanism 816, the removal device 817 can eject airstream towards the solar cell module SC supported on the third conveying mechanism 816. By doing so, the cell plates CL and the conductive ribbons unfixed on the glass plate GP of the solar cell module SC can be blown off the third conveying mechanism 816 via the gaps existing between rollers thereof so as to be easily collected and cleared.

Following the removal of the solar cell module SC from the thermal pad 8142 caused by the blocker 815, the thermal pad 8142 without carrying a solar cell module SC then returns to the high temperature area 81211 from the low temperature area 81212 along the track 8141. The thermal pad 8142 is reheated to reach a temperature substantially equal to that of the first space 8111 during the return thereof for readiness to carry another solar cell module SC transferred from the first outlet 8113 in the subsequent stage.

In the abovementioned embodiment, the high temperature area 81211 is designed to be located above the low temperature area 81212 along the gravity direction Z, such that the hot gas generated from the thermal decomposition can naturally rise upwards due to the principle of thermal convection so as to be accumulated at the top region of the heat-preserving zone 812. This prevents affecting the temperature of the low temperature area 81212 at the below. However, the present disclosure it not limited thereto. In some embodiments of the present disclosure, provided that the gradual cooling environment can be accurately controlled, the high temperature area may be designed to be located below the low temperature area.

In some embodiments of the present disclosure, the heating zone may further have a vent for evacuating the gas generated from the decomposition of the sealing adhesive.

In some embodiments of the present disclosure, the solar cell module may be vertically transported in the heating zone, as long as sufficient gas-extraction or gas-exhaust apparatus is disposed within the first space for preventing any generated gas from the decomposition naturally rising due to the principle of thermal convection from affecting the decomposition of the solar cell module located at the above along the gravity direction (the vertical direction).

In some embodiments of the present disclosure, the first temperature adjustment devices in the heat-preserving zone may be alternatively disposed on sides of the thermal pads away from their supporting surfaces, with a proper control in gradually decreasing the heating temperature thereof during the movement from the high temperature area to the low temperature area, for also providing a gradual cooling environment to the thermal pads along with the solar cell modules thereon.

In some embodiments of the present disclosure, the blocker is optional, and the gradually cooled down solar cell module can be transferred onto the third conveying mechanism by any suitable tool such as a clamp.

In some embodiments of the present disclosure, the third conveying mechanism as a conveyor line may be a belt conveyor without gaps, and the cell plates and the conductive ribbons unfixed on the glass plate of the solar cell module can be blown off the third conveying mechanism through two opposite sides of the belt conveyor.

In some embodiments of the present disclosure, the removal device may alternatively be a brush configured to brush the cell plates and the conductive ribbons unfixed on the glass plate of the solar cell module off the third conveying mechanism.

In some embodiments of the present disclosure, the removal device may alternatively be a clamp configured to clamp the glass plate. This enables the glass plate to be inclined, facilitating the removal of the cell plates and the conductive ribbons from the glass plate due to gravity.

In some embodiments of the present disclosure, the removal device is optional, and the third conveying mechanism can be arranged inclined for facilitating the removal of the cell plates and the conductive ribbons from the glass plate due to gravity.

Figure 23:
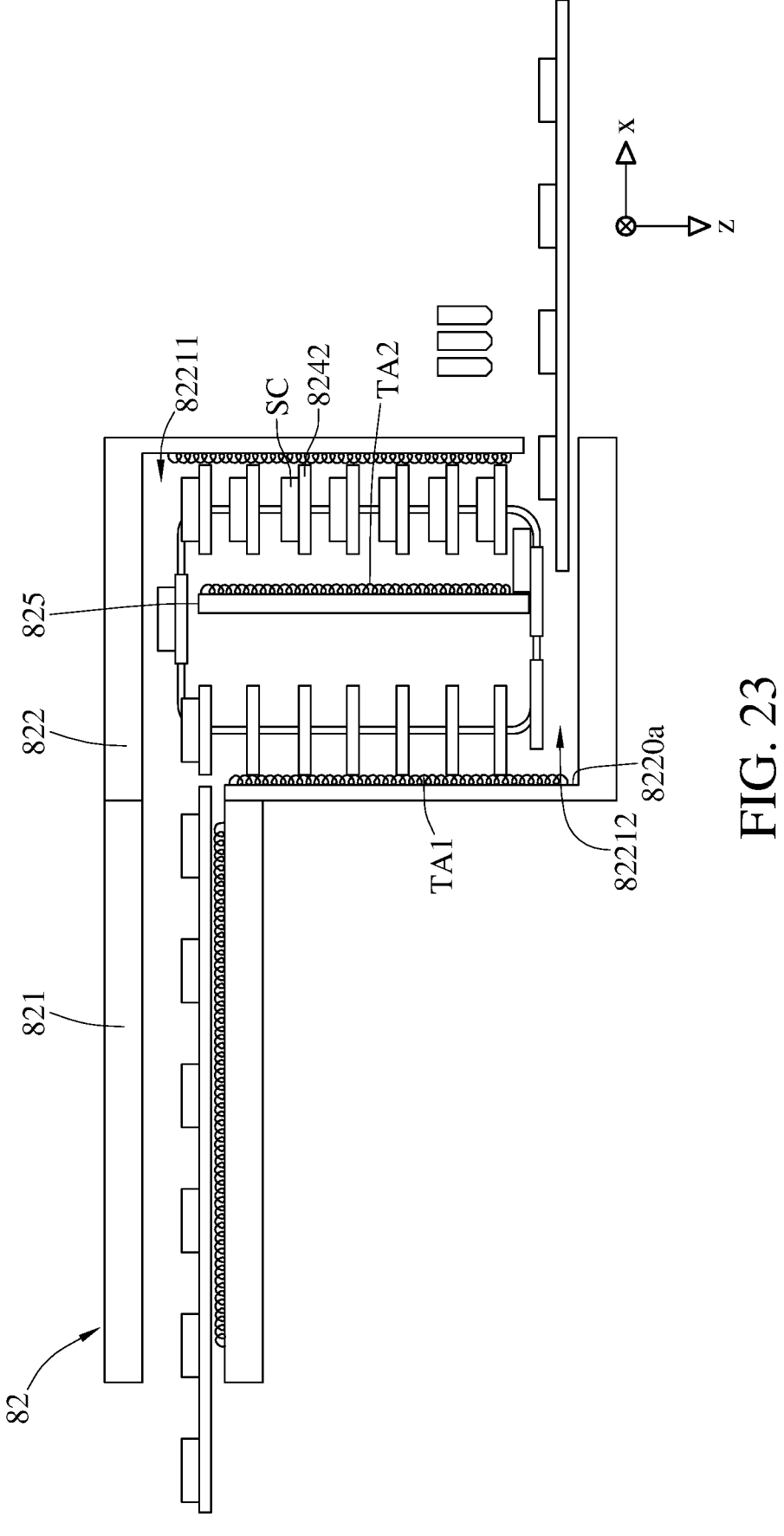
FIG. 23 is a side view of a thermal decomposition apparatus configured to decompose solar cell modules according to still further another embodiment of the present disclosure.

Please refer to FIG. 23, which is a side view of a thermal decomposition apparatus 82 configured to decompose solar cell modules SC according to still further another embodiment of the present disclosure. Please be noted that some lateral walls of the thermal decomposition apparatus 82 are omitted in FIG. 23 for clearly showing inner structures of the thermal decomposition apparatus 82. The thermal decomposition apparatus 82 in this embodiment is similar to the thermal decomposition apparatus 81 in the previous embodiment in structure, and only difference between this and previous embodiments, as well as related description, will be illustrated hereinafter.

According to the thermal decomposition apparatus 82 of the still further another embodiment of the present disclosure, the blocker 825 can extend from the low temperature area 82212 to the high temperature area 82211, and the thermal decomposition apparatus 82 may further include a plurality of second temperature adjustment devices TA2. The second temperature adjustment devices TA2 may be heaters substantially the same as the first temperature adjustment devices TA1. The second temperature adjustment devices TA2 are disposed on the blocker 825 located in the high temperature area 82211 and the low temperature area 82212, and the second temperature adjustment devices TA2 are located adjacent to the path where the thermal pads 8242 move from the high temperature area 82211 to the low temperature area 82212. The heating temperature of the second temperature adjustment devices TA2 is gradually decreased from the high temperature area 82211 to the low temperature area 82212. The second temperature adjustment devices TA2 disposed on the blocker 825 is closer to the movement path of the thermal pads 8242 with solar cell modules SC carried thereon than the first temperature adjustment devices TA1 disposed on the lateral wall 8220a at a side of the heat-preserving zone 822 close to the heating zone 821. Accordingly, the stability of the gradual cooling environment provided for the thermal pads 8242 with solar cell modules SC carried thereon can be further ensured by the second temperature adjustment devices TA2.

Figure 24:
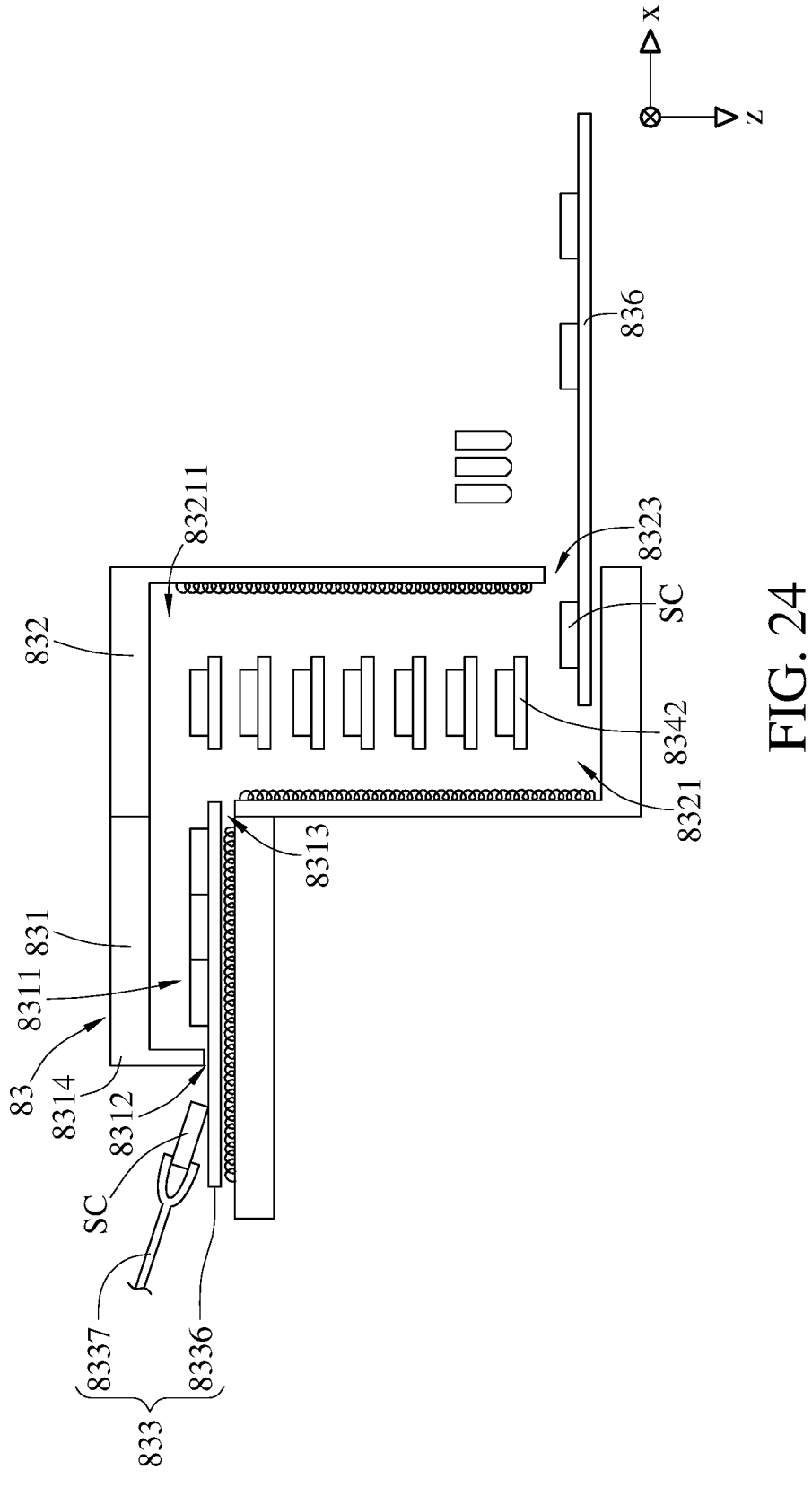
FIG. 24 is a side view of a thermal decomposition apparatus configured to decompose solar cell modules according to still further another embodiment of the present disclosure.

Please refer to FIG. 24, which is a side view of a thermal decomposition apparatus 83 configured to decompose solar cell modules SC according to still further another embodiment of the present disclosure. Please be noted that some lateral walls of the thermal decomposition apparatus 83 are omitted in FIG. 24 for clearly showing inner structures of the thermal decomposition apparatus 83. The thermal decomposition apparatus 83 in this embodiment is similar to the thermal decomposition apparatus 81 in the previous embodiment in structure, and only difference between this and previous embodiments, as well as related description, will be illustrated hereinafter.

According to the thermal decomposition apparatus 83 of the still further another embodiment of the present disclosure, the first conveying mechanism 833 may alternatively include a transportation passage 8336 and a pushing device 8337. The transportation passage 8336 may be, for example, a non-actively-powered flat plate, and the transportation passage 8336 extends from the first inlet 8312 to the first outlet 8313. The pushing device 8337 may be, for example, a mechanical arm, and the pushing device 8337 is located out of the first space 8311. The pushing device 8337 can sequentially push solar cell modules SC to be thermally decomposed into the first space 8311 one by one. In specific, the pushing device 8337 can place a solar cell module SC at a position adjacent to the first inlet 8312 and onto the transportation passage 8336 and then can push the solar cell module SC into the first space 8311 so as to indirectly push other solar cell modules SC already heated in the first space 8311 towards the first outlet 8313. In some embodiments of the present disclosure, the transportation passage may be a horizontally placed roller conveyor without active power which can reduce friction in pushing solar cell modules. In this embodiment, the solar cell modules SC experience briefly pause in the first space 8311 between every pushing exerted by the pushing device 8337, and the movement of the solar cell modules SC in the first space 8311 is intermittently interrupted several times. This intentional interruption of movement ensures adequate heating of the solar cell modules SC, such that the first space 8311 can be designed compact, thereby conserving space utilization of the heating zone 831. Moreover, in this embodiment, another mechanical arm or clamp (not shown) can be utilized to enable the transfer of solar cell modules SC to the third conveying mechanism 836, and the solar cell modules SC on the third conveying mechanism 836 can be then moved out of the second space 8321 via the second outlet 8323. Further, this another mechanical arm or clamp can also be utilized to transfer thermal pads 8342 back to the high temperature area 83211 for readiness to carry other solar cell modules SC in the subsequent stage. With the arrangement, the abovementioned track and blocker can be omitted, such that the second space 8321 can be designed narrow, thereby conserving space utilization of the heat-preserving zone 832. However, the present disclosure is not limited thereto. In some other embodiments of the present disclosure, the thermal pads can be moved out of the second space along with the transfer of the solar cell modules by the another mechanical arm or clamp, and then the thermal pads can be transferred back to the high temperature area for readiness to carry other solar cell modules in the subsequent stage, thereby conserving space utilization of the second conveying mechanism.

According to the thermal decomposition apparatus 83 of the still further another embodiment of the present disclosure, the heating zone 831 may further have a gate element 8314 that covers at least part of the first inlet 8312. The gate element 8314 is opened when the pushing device 8337 pushes a solar cell module SC into the first space 8311, such that the heat in the first space 8311 can be prevented from being dissipated to the outside through the first inlet 8312. In some embodiments of the present disclosure, the gate element may completely cover the first inlet, such that the heat in the first space can be further prevented from being dissipated.

Figure 25:
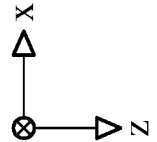
FIG. 25 is a side view of a thermal decomposition apparatus configured to decompose solar cell modules according to still further another embodiment of the present disclosure.
Figure 26:
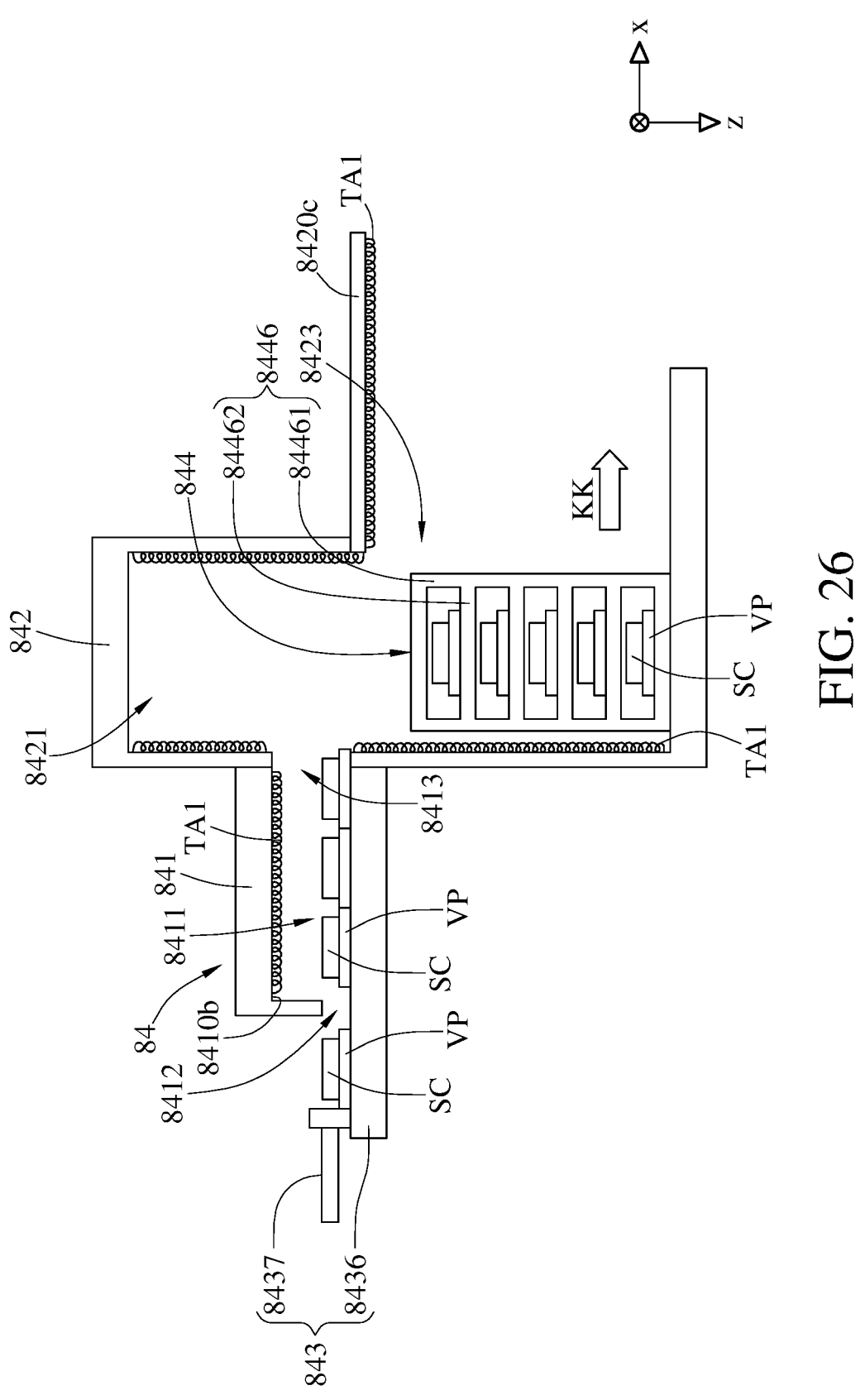
FIG. 26 is a side view showing the thermal decomposition apparatus in FIG. 25 when the solar cell modules are already cooled down.

Please refer to FIG. 25 and FIG. 26, where FIG. 25 is a side view of a thermal decomposition apparatus 84 configured to decompose solar cell modules SC according to still further another embodiment of the present disclosure, and FIG. 26 is a side view showing the thermal decomposition apparatus 84 in FIG. 25 when the solar cell modules SC are already cooled down. Please be noted that some lateral walls of the thermal decomposition apparatus 84 are omitted in FIG. 25 and FIG. 26 for clearly showing inner structures of the thermal decomposition apparatus 84. The thermal decomposition apparatus 84 in this embodiment is similar to the thermal decomposition apparatus 81 in the previous embodiment in structure, and only difference between this and previous embodiments, as well as related description, will be illustrated hereinafter.

According to the thermal decomposition apparatus 84 of the still further another embodiment of the present disclosure, the first temperature adjustment devices TA1 in the heating zone 841 may be alternatively disposed on the upper wall 8410$b$ above the first space 8411 so as to heat the first space 8411 along the vertical direction (the gravity direction Z). The first conveying mechanism 843 may alternatively include a transportation passage 8436 and a pushing device 8437. The transportation passage 8436 may be, for example, a lower wall without active power at the below of the heating zone 841, and the transportation passage 8436 extends from the first inlet 8412 to the first outlet 8413. The pushing device 8437 is located out of the first space 8411. The pushing device 8437 can place a solar cell module SC to be thermally decomposed onto a thermal pad VP supported on the transportation passage 8436, and then the pushing device 8437 can sequentially push the thermal pad VP and the solar cell module SC thereon into the first space 8411 one by one along the horizontal direction X, as denoted by the arrow II in FIG. 25. In specific, the pushing device 8437 can place a solar cell module SC and a thermal pad VP at a position adjacent to the first inlet 8412 and onto the transportation passage 8436 and then can push the solar cell module SC and the thermal pad VP into the first space 8411 along the horizontal direction X so as to indirectly push other solar cell modules SC and other thermal pads VP already heated in the first space 8411 towards the first outlet 8413. In this embodiment, the solar cell modules SC and the thermal pads VP experience briefly pause in the first space 8411 between every pushing exerted by the pushing device 8437, and the movement of the solar cell modules SC and the thermal pads VP in the first space 8411 is intermittently interrupted several times. This intentional interruption of movement ensures adequate heating of the solar cell modules SC, such that the first space 8411 can be designed compact, thereby conserving space utilization of the heating zone 841.

According to the thermal decomposition apparatus 84 of the still further another embodiment of the present disclosure, the second conveying mechanism 844 can be alternatively a movable accommodation cabinet 8446. Specifically, the movable accommodation cabinet 8446 is movably disposed so as to be raised and lowered in the second space 8421, and the movable accommodation cabinet 8446 includes a plurality of lateral walls 84461 and a plurality of shelves 84462 disposed between the lateral walls 84461 for forming a plurality of accommodation spaces AS. Each accommodation space AS can accommodate a stack of one solar cell module SC and one thermal pad VP. The heating temperature of the first temperature adjustment devices TA1 in the heat-preserving zone 842 is gradually decreased from the high temperature area 84211 to the low temperature area 84212 along the vertical direction (the gravity direction Z) for providing a gradual cooling environment in the second space 8421 along the gravity direction Z. One stack of the solar cell module SC and the thermal pad VP adequately heated in the first space 8411 can be pushed into one accommodation space AS, and then the movable accommodation cabinet 8446 can be lowered a certain distance along the gravity direction Z, as denoted by the arrow JJ in FIG. 25. As the movable accommodation cabinet 8446 is lowered a certain distance, another accommodation space AS at the above can be aligned with the first outlet 8413 for readiness to carry next stack of one solar cell module SC and one thermal pad VP to be pushed therein. During the downward movement of the movable accommodation cabinet 8446, the solar cell modules SC and the thermal pads VP in the movable accommodation cabinet 8446 are gradually cooled down. When the movable accommodation cabinet 8446 is completely moved to the low temperature area 84212, a rotatable lateral wall 8420c of the heat-preserving zone 842 can be opened to enable a space communication connection between the second outlet 8423 and outside. Then, the movable accommodation cabinet 8446, together with the solar cell modules SC and the thermal pads VP accommodated therein, can be moved out of the heat-preserving zone 842, as denoted by the arrow KK in FIG. 26. Since the rotatable lateral wall 8420c is opened only in the final step, an overly heat exchange between the low temperature area 84212 and the outside can be prevented. Therefore, the accuracy of the temperature control of the first temperature adjustment devices TA1 during the movement of the movable accommodation cabinet 8446 to the low temperature area 84212 can be further ensured, and excessive power consumption can also be prevented. Moreover, the heating temperature of the first temperature adjustment devices TA1 in the heat-preserving zone 842 can be increased to a temperature substantially equal to that in the heating zone 841 while other solar cell modules SC and thermal pads VP of the next batch are being heated in the heating zone 841. This simultaneous heating in both the heating zone 841 and the heat-preserving zone 842 allows for time-saving execution of the heating processes, thereby enhancing efficiency.

According to the thermal decomposition apparatus discussed above, the heating temperature of the first temperature adjustment devices to the second space is gradually decreased from the high temperature area to the low temperature area along the vertical direction (the gravity direction). The arrangement of the first temperature adjustment devices along the lateral sides of the solar cell module (along the horizontal direction) facilitates the gradual cooling process, which can preserve the heat within the solar cell module from rapid dissipation during the movement from the high temperature area to the low temperature area. This ensures the uniform cooling of the solar cell module, thereby enhancing a consistent temperature distribution across its entire surface. As such, the temperature difference between any two points on the entire surface of the glass plate of the solar cell module can be kept equal to or less than 15 degrees Celsius, mitigating the risk of glass plate GP breakage caused by disparate cooling rates. Moreover, the cooling process can be further intensified to result in a greater temperature decreasing from the high temperature area to the low temperature area, as long as the glass plate can maintain uniform cooling, which can enhance the efficiency of the cooling process. For example, the temperature reduction rate of the gradual cooling process may range from 40 to 60 degrees Celsius per meter of descent. The present disclosure can provide a vertical and quick cooling design to significantly conserve space utilization and working time of the thermal decomposition apparatus, and the power consumption can also be reduced due to shortened working time.

The embodiments are chosen and described in order to best explain the principles of the present disclosure and its practical applications, to thereby enable others skilled in the art best utilize the present disclosure and various embodiments with various modifications as are suited to the particular use being contemplated. It is intended that the scope of the present disclosure is defined by the following claims and their equivalents.

What is claimed is:

1. A thermal decomposition apparatus, configured to decompose a solar cell module, the thermal decomposition apparatus comprising:

a heating zone, having a first space, a first inlet and a first outlet that are in space communication connection with one another, wherein the first inlet and the first outlet are located at two opposite sides of the first space;

a cooling zone, having a second space, a second inlet and a second outlet that are in space communication connection with one another, wherein the second inlet is selectively in space communication connection with the first outlet of the heating zone;

a first conveying mechanism, at least partially disposed in the first space, wherein the first conveying mechanism is configured to move the solar cell module from the first inlet to the first outlet; and a second conveying mechanism, comprising:

a carrier, disposed in the second space, wherein the carrier has an inclined surface, a position of the inclined surface located adjacent to the second inlet is higher than a position of the inclined surface located adjacent to the second outlet along a gravity direction, the carrier is configured to move the solar cell module from the second inlet to the second outlet via the inclined surface;

wherein a direction from the first inlet to the first outlet is non-parallel to a direction from the second inlet to the second outlet.

2. The thermal decomposition apparatus according to claim 1, wherein the carrier comprising at least one inclined part and at least one flat part, the at least one inclined part has the inclined surface, and the at least one flat part has a ventilation hole.

3. The thermal decomposition apparatus according to claim 2, wherein the carrier further comprises at least one blocking part, and the at least one blocking part is disposed at a position of the at least one inclined part adjacent to the second outlet and at a side of the inclined surface.

4. The thermal decomposition apparatus according to claim 2, wherein the carrier further comprises a plurality of rolling parts rotatably disposed on the inclined surface of the at least one inclined part.

5. The thermal decomposition apparatus according to claim 1, wherein the second conveying mechanism further comprises a lifting device that is movably disposed in the second space and connected to the carrier.

6. The thermal decomposition apparatus according to claim 1, wherein the carrier further has a plurality of ventilation holes that are arranged along a plurality of rows, distances between the plurality of rows and the second outlet are different, and the plurality of ventilation holes in adjacent two of the plurality of rows are misaligned.

7. The thermal decomposition apparatus according to claim 1, wherein the first conveying mechanism comprises a transportation passage and a pushing device, the transportation passage extends from the first inlet to the first outlet, the pushing device is located outside the first space, and the pushing device is configured to push the solar cell module to the transportation passage inside the first space, wherein the pushing device comprises a mechanical arm.

8. The thermal decomposition apparatus according to claim 7, wherein the first conveying mechanism further comprises a plurality of rolling parts that are rotatably disposed on the transportation passage, and the plurality of rolling parts are configured to support the solar cell module via at least one thermal pad.

9. The thermal decomposition apparatus according to claim 1, further comprising a partition gate that is disposed between the heating zone and the cooling zone to selectively connect the first outlet and the second inlet.

10. The thermal decomposition apparatus according to claim 1, further comprising an entrance gate and an exit gate, wherein the entrance gate is disposed at the first inlet to selectively cover the first inlet, and the exit gate is disposed at the second outlet to selectively cover the second outlet.

11. The thermal decomposition apparatus according to claim 10, further comprising a middle gate that is disposed between the first inlet and the first outlet to selectively and partially separate the first space.

12. The thermal decomposition apparatus according to claim 1, wherein a number of the carrier inside the cooling zone is one.

13. The thermal decomposition apparatus according to claim 1, further comprising a plurality of temperature adjustment devices that are disposed in or on the heating zone and the cooling zone, wherein the plurality of temperature adjustment devices comprise a plurality of heaters.

14. The thermal decomposition apparatus according to claim 1, further comprising a third conveying mechanism that is disposed at the second outlet of the cooling zone and configured to move a decomposed solar cell module outside the cooling zone.

15. The thermal decomposition apparatus according to claim 1, further comprising a plurality of exhausting pipes that are disposed to the heating zone and the cooling zone.

16. The thermal decomposition apparatus according to claim 1, wherein the carrier is configured to support the solar cell module via at least one thermal pad on the inclined surface, and the carrier is configured to provide airflow to the at least one thermal pad through a ventilation hole of the carrier during movement of the solar cell module from the second inlet to the second outlet.

17. A thermal decomposition apparatus, configured to decompose a solar cell module, the thermal decomposition apparatus comprising:

a heating zone, having a first space, a first inlet and a first outlet that are in space communication connection with one another, wherein the first inlet and the first outlet are located at two opposite sides of the first space;

a heat-preserving zone, having a second space, a second inlet and a second outlet that are in space communication connection with one another, wherein the second inlet is in space communication connection with the first outlet of the heating zone;

a first conveying mechanism, at least partially disposed in the first space, wherein the first conveying mechanism is configured to move the solar cell module from the first inlet to the first outlet; and a second conveying mechanism, at least partially disposed in the second space, wherein the second conveying mechanism is configured to move the solar cell module from the second inlet to the second outlet;

wherein a direction from the first inlet to the first outlet is non-parallel to a direction from the second inlet to the second outlet.

18. The thermal decomposition apparatus according to claim 17, wherein the first conveying mechanism is a conveyor line that extends from the first inlet to the first outlet.

19. The thermal decomposition apparatus according to claim 17, wherein the first conveying mechanism comprises a transportation passage and a pushing device, the transportation passage extends from the first inlet to the first outlet, the pushing device is located outside the first space, and the pushing device is configured to push the solar cell module to the transportation passage inside the first space, wherein the pushing device comprises a mechanical arm.

20. The thermal decomposition apparatus according to claim 17, wherein the second conveying mechanism comprises a track and at least one thermal pad, the track is disposed in the second space, the at least one thermal pad is movably disposed on the track, and the at least one thermal pad is configured to support the solar cell module.

21. The thermal decomposition apparatus according to claim 20, further comprising a blocker that is located in the second space, wherein the blocker is configured to abut against the solar cell module on the at least one thermal pad when the at least one thermal pad is moved adjacent to the second outlet so as to move the solar cell module to the second outlet.

22. The thermal decomposition apparatus according to claim 21, further comprising a plurality of temperature adjustment devices that are disposed on the blocker and are adjacent to at least part of a path of the at least one thermal pad moving from the second inlet to the second outlet, wherein the plurality of temperature adjustment devices comprise a plurality of heaters.

* * * * *